(12) United States Patent
Kuwazawa

(10) Patent No.: US 7,402,881 B2
(45) Date of Patent: Jul. 22, 2008

(54) SOLID STATE IMAGING DEVICE AND METHOD OF DRIVING THE SAME

(75) Inventor: Kazunobu Kuwazawa, Chino (JP)

(73) Assignee: Seiko Epson Corporation (JP)

( * ) Notice: Subject to any disclaimer, the term of this patent is extended or adjusted under 35 U.S.C. 154(b) by 854 days.

(21) Appl. No.: 10/944,695

(22) Filed: Sep. 17, 2004

(65) Prior Publication Data

US 2005/0099517 A1 May 12, 2005

(30) Foreign Application Priority Data

Sep. 19, 2003 (JP) ............................. 2003-327984

(51) Int. Cl.
- H01L 31/062 (2006.01)
- H01L 31/113 (2006.01)
- H01L 31/0203 (2006.01)
- H01L 31/0232 (2006.01)

(52) U.S. Cl. ........................ 257/434; 257/292; 257/435
(58) Field of Classification Search ......... 257/290–294, 257/431–448, E27
See application file for complete search history.

(56) References Cited

U.S. PATENT DOCUMENTS

| | | | | |
|---|---|---|---|---|
| 6,677,627 B2 * | 1/2004 | Miida | .......................... | 257/292 |
| 2007/0075338 A1 * | 4/2007 | Park et al. | .................... | 257/222 |
| 2007/0278544 A1 * | 12/2007 | Shinohara | .................... | 257/292 |

FOREIGN PATENT DOCUMENTS

JP 2002-134729 5/2002

* cited by examiner

*Primary Examiner*—Cuong Q Nguyen
(74) *Attorney, Agent, or Firm*—Harness, Dickey & Pierce, P.L.C.

(57) ABSTRACT

A solid state imaging device comprising: a pixel region including a matrix of cells; reading means driving a modulation transistor and a residual electric charge discharging control element and carrying out different controls to cells where reading is and is not carried out, in a modulation period when a signal modulation output based on photo-generated electric charges accumulated in a modulation well, and a noise modulation output based on a noise component are obtained; clear means driving the modulation transistor and the discharging control element, and carrying out different controls to cells where a clear is and is not carried out, in a clear period when residual electric charges in the modulation well are discharged; and dummy clear means controlling the clear means, and carrying out control for a cell where the clear is not carried out, to all the cells, before reading a first line from the pixel region.

8 Claims, 12 Drawing Sheets

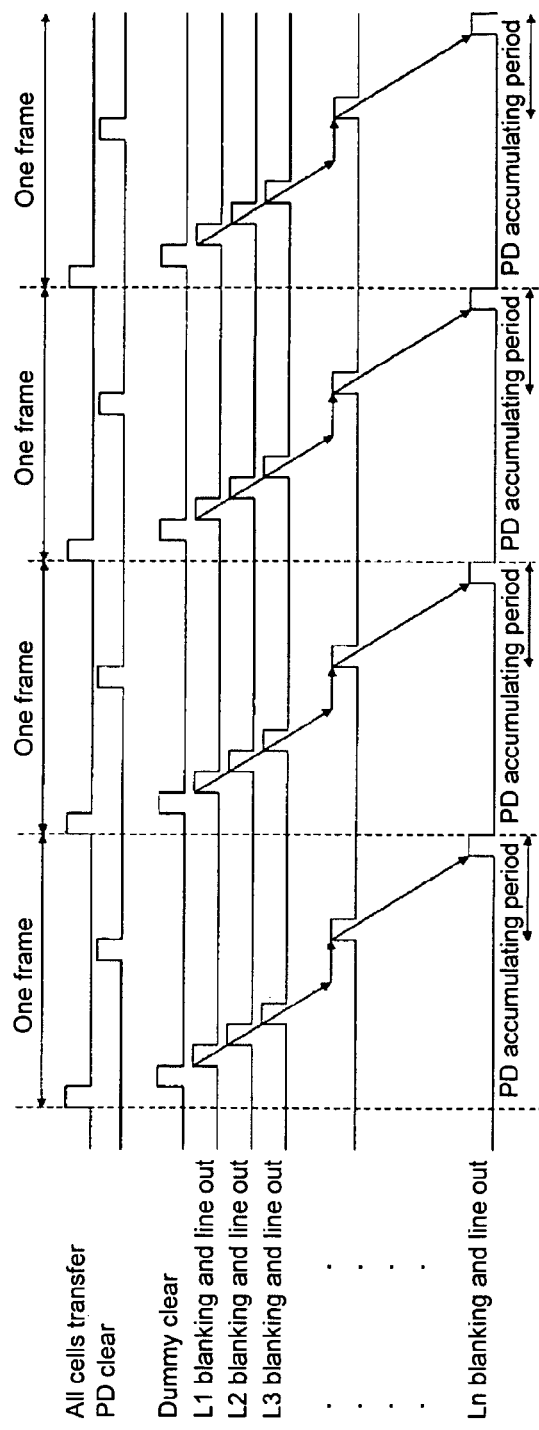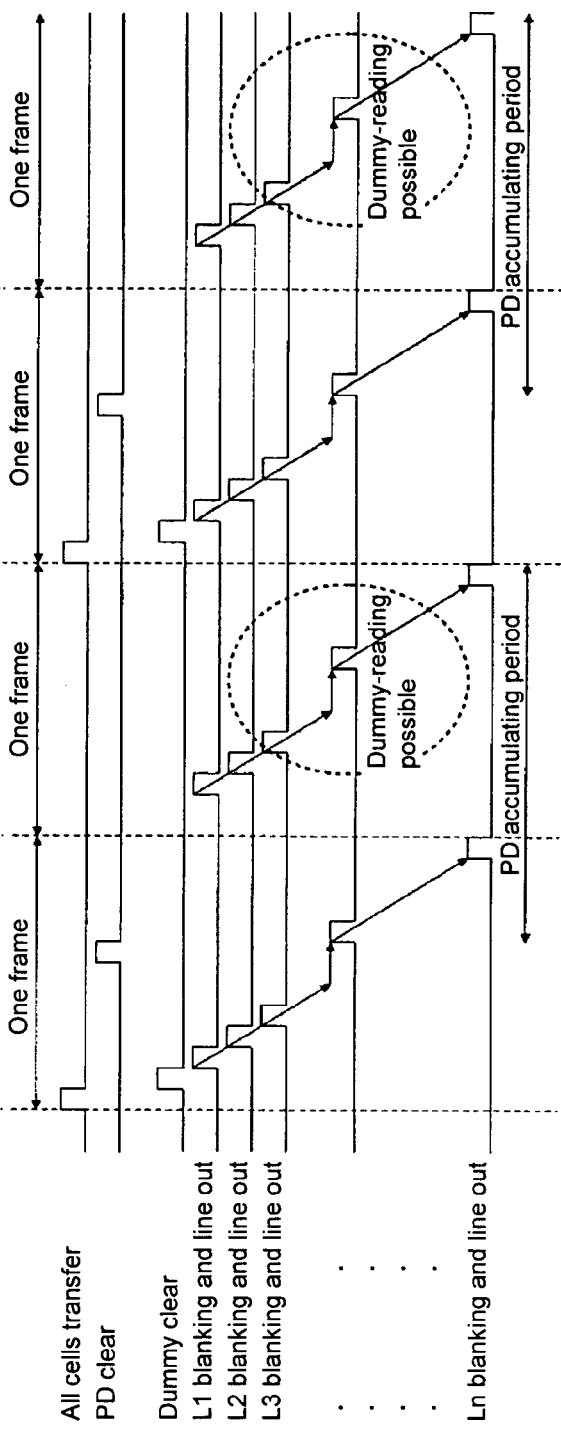

SOLID STATE IMAGING DEVICE AND METHOD OF DRIVING THE SAME

RELATED APPLICATIONS

This application claims priority to Japanese Patent Application No. 2003-327984 filed Sep. 19, 2003 which is hereby expressly incorporated by reference herein in its entirety.

BACKGROUND

1. Field of the Invention

The present invention relates to a solid state imaging device having a high quality picture and low power consumption, and a method of driving the same.

2. Description of the Related Art

Solid state imaging devices carried in cellular phones or the like include a CCD (charge coupled device) type image sensor and a CMOS type image sensor. The CCD type image sensor is excellent in picture quality and the CMOS type image sensor consumes lower power and its process cost is low. In recent years, MOS type solid state imaging devices using a threshold voltage modulation method which combines both a high quality picture and low power consumption have been proposed. A MOS type solid state imaging device using the threshold voltage modulation method is disclosed in Japanese Unexamined Patent Publication No. 2002-134729, for example.

In the solid state imaging device of Japanese Unexamined Patent Publication No. 2002-134729, the picture output is obtained by arranging unit pixels in a matrix form and repeating three states of initialization, accumulation, and reading. Moreover, in the solid state imaging device of Japanese Unexamined Patent Publication No. 2002-134729, each unit pixel has a photo-diode, a modulation transistor, and an overflow drain gate. The gate of the modulation transistor is formed in a ring shape.

Electric charges (photo-generated electric charges) generated by light incident upon the photo-diode are transferred to a P-type well region formed under a ring gate, and accumulated in a carrier pocket formed in this region. The threshold voltage of the modulation transistor changes corresponding to the photo-generated electric charges accumulated in the carrier pocket. Accordingly, a signal (pixel signal) corresponding to incident light is obtained from a terminal coupled to the source region of the modulation transistor.

In the above described conventional solid state imaging device, a picture signal corresponding to light incident upon the photo-diode in an accumulating period is outputted in a reading period. By accumulating photo-generated electric charges generated by the photo-diode in a carrier pocket, the picture signal corresponding to incidence light is obtained. The photo-generated electric charges accumulated in the carrier pocket are discharged at the time of initialization.

For example, in the device of Japanese Unexamined Patent Publication No. 2002-134729, with respect to a selected line selected line), the photo-generated electric charges of the carrier pocket are read, and with respect to a non-selected line, the photo-generated electric charges remain accumulated in the carrier pocket. An accumulating period, a reading period or an initialization period are set for a selected line and a non-selected line, respectively.

In the device of Japanese Unexamined Patent Publication No. 2002-134729, a flow of the photo-generated electric charges in the accumulating period, reading period, and initialization period is controlled by the potential gradient of each part.

However, the design of a layer thickness and the design of an impurity profile or the like are complicated, and it is extremely difficult to obtain an ideal potential gradient. For this reason, actually, carrier leakage, which the photo-generated electric charges accumulated in the carrier pocket flow out, occurs even in the non-selected lines.

In this case, if the carrier leakage occurs similarly with respect to all unit pixels, there will be no specific problems from a viewpoint of pixel variation, however, in the case where there exists a line in which carrier leakage occurs and a line in which the carrier leakage does not occur, there will be a problem that the dynamic range and the saturation output vary for each of these lines, and thereby the picture quality will degrade.

The present invention has been made in view of this problem, and is intended to provide a solid state imaging device which can make the dynamic range and the saturation output uniform and improve the picture quality by conforming the carrier leakage of all the pixels, and a method of driving the same.

SUMMARY

A solid state imaging device according to the present invention comprises: a pixel region formed by arranging a cell in a matrix form the cell comprising: a photoelectric conversion element that generates photo-generated electric charges corresponding to incident light; an accumulation well that accumulates the photo-generated electric charges; a modulation well that stores the photo-generated electric charges transferred from the accumulation well; a modulation transistor whose threshold voltage of a channel is controlled by the photo-generated electric charges stored in the modulation well and that outputs a pixel signal corresponding to the photo-generated electric charges; and a residual electric charge discharging control element that controls a potential barrier of a residual electric charge discharging channel coupled to the modulation well and discharges the residual electric charges in the modulation well through the residual electric charge discharging channel; a reading means for driving the modulation transistor and the residual electric charge discharging control element, and carrying out mutually different controls to a cell where a reading is carried out, and to a cell where a reading is not carried out, in a modulation period that a signal modulation output based on the photo-generated electric charges accumulated in the modulation well, and a noise modulation output based on a noise component are obtained; a clear means for driving the modulation transistor and the residual electric charge discharging control element, and carrying out mutually different controls to a cell where a clear is carried out, and to a cell where a clear is not carried out, in a clear period that residual electric charges remaining in the modulation well are discharged; and a dummy clear means for controlling the clear means, and carrying out the control for a cell where the clear is not carried out by the clear means to all the cells, before reading a first line from the pixel region.

According to such a structure the photo-generated electric charges generated by the photoelectric conversion element are accumulated in the accumulation well. The photo-generated electric charges accumulated in the accumulation well are transferred to the modulation well. The threshold voltage of the channel of the modulation transistor is controlled by the photo-generated electric charges stored in the modulation well, and a pixel signal corresponding to the photo-generated electric charges is outputted from the modulation transistor. The residual electric charge discharging control element controls the potential barrier of the residual electric charge discharging channel coupled to the modulation well, and discharges the residual electric charges in the modulation well through the residual electric charge discharging channel. In this case, the clear means carries out mutually different controls to a cell where a clear is carried out and to a cell where a clear is not carried out, in the discharging period of the residual electric charges remaining in the modulation well. Carrier leakage of the photo-generated electric charges in the modulation well occurs by a control to a cell where a clear is not carried out. The dummy clear means controls the clear means, and carries out a control for a cell where the clear is not carried, to all the cells, before reading a first line from the pixel region. Accordingly, carrier leakage will occur from the modulation well of all the cells before reading the first line of the pixel region, and thus generation of a cell in which carrier leakage does not occur, and a cell in which carrier leakage occurs can be prevented. Thereby, the picture quality can be improved by making the dynamic range and the saturation output uniform in the entire pixel region.

Furthermore, the dummy clear means carries out, the control for the cell where the reading is not carried out by the modulation means, the control for the cell where the clear is not carried out by the clear means, and the control for the cell where the reading is not carried out by the modulation means, to all the cells, before reading the first line from the pixel region.

According to such a structure, the dummy clear means carries out the same control, as the control for a cell where the reading or the clear is not carried out at the time of reading a pixel signal by the reading means and the clear means, to all the cells. Accordingly, the influence of carrier leakage by the control of the dummy clear means and the influence of the carrier leakage by the clear means will be made equal, and the dynamic range and the saturation output can be made more uniform in the entire pixel region.

The solid state imaging device further includes a transfer control element that controls transfer of the photo-generated electric charges by changing a potential barrier of the transfer channel between the accumulation well and the modulation well, wherein the dummy clear means carries out, the control for the cell where the clear is not carried out by the clear means, to all the cells, after transferring the photo-generated electric charges by the transfer control element.

According to such a structure, carrier leakage by the control of the dummy clear means can surely occur after transferring the photo-generated electric charges, and thus, the picture quality can be improved by surely uniforming the influence of carrier leakage in all the pixels, regardless of the driving sequence thereof.

Moreover, the first line in which a reading is carried out from the pixel region is the line that is read at the time of a decimating process.

According to such a structure, even at the time of the decimating process in which a reading from an optical black region is not carried out before reading a pixel region, the influence by the carrier leakage can be uniformed in the entire pixel region.

A method of driving a solid state imaging device according to the present invention comprises: an accumulation well that accumulates photo-generated electric charges generated by a photoelectric conversion element corresponding to incident light; a modulation well that controls a threshold voltage of a channel of a modulation transistor by storing the photo-generated electric charges; a residual electric charge discharging control element that controls a potential barrier of a residual electric charge discharging channel coupled to the modulation well; a reading means for driving the modulation transistor and the residual electric charge discharging control element, and carrying out mutually different controls with respect to a cell where a reading is carried out, and to a cell where a reading is not carried out, in a modulation period that a signal modulation output based on the photo-generated electric charges accumulated in the modulation well, and a noise modulation output based on a noise component are obtained; a clear means for driving the modulation transistor and the residual electric charge discharging control element, and carrying out mutually different controls to a cell where a clear is carried out, and to a cell where a clear is not carried out, in a clear period that residual electric charges remaining in the modulation well are discharged, the method comprising: a dummy clear step for carrying out a control for a cell where the clear is not carried out by the clear means, to all the cells, before reading the first line from a pixel region; and a reading step, comprising a signal modulation by the reading means a clear by the clear means and a noise modulation by the reading means.

According to such a structure, first of all, a control for a cell where a clear is not carried out by the clear means is carried out to all the cells before reading the first line from the pixel region. Accordingly, carrier leakage occurs from the modulation well of all the cells before reading the first line form the pixel region. Next, the reading step including the signal modulation by the reading means, the clear by the clear means, and the noise modulation by the reading means is carried out. Before carrier leakage occurs in the cell in which a reading is not carried out by the reading step, carrier leakage has already occurred from the modulation well of all the cells, and thus the picture quality can be improved by uniforming the dynamic range and the saturation output in the entire pixel region.

Furthermore, the dummy clear step carries out, the control for the cell where the reading is not carried out by the modulation means, the control for the cell where the clear is not carried out by the clear means, and the control for the cell where the reading is not carried out by the modulation means, to all the cells, before reading the first line from the pixel region.

According to such a structure, the dummy clear step carries out the same control, as the control for a cell where the reading or the clear is not carried out at the time of reading a pixel signal, to all the cells. Accordingly, uniform carrier leakage will occur in all the pixels by the dummy clear step. Accordingly, the dynamic range and the saturation output can be made uniform much more in the entire pixel region.

Furthermore, the solid state imaging device further includes a transfer control element that controls a potential barrier of a transfer channel between the accumulation well and the modulation well, and the dummy clear step carries out the control for the cell where the clear is not carried out by the clear means, to all the cells, after transferring the photo-generated electric charges by the transfer control element.

According to such a structure, the carrier leakage by the control of the dummy clear step can surely occur after transferring the photo-generated electric charges, and thus, the picture quality can be improved regardless of a driving sequence by surely uniforming the influence of the carrier leakage in all the pixels.

BRIEF DESCRIPTION OF THE DRAWINGS

Figures 7A, 7B, 7C, 7D, 7E:
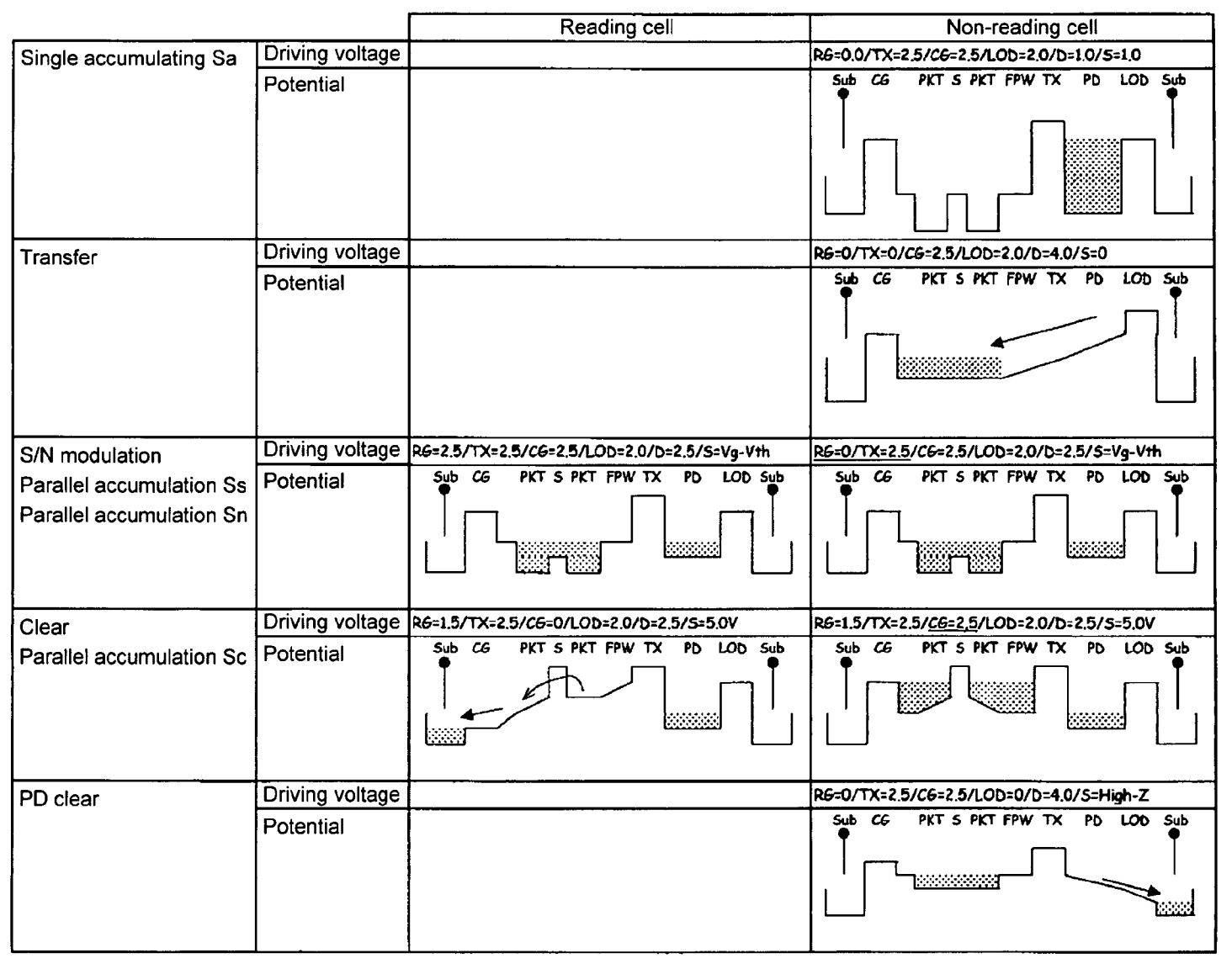

FIGS. 7A-E are diagrams showing the potential relationship for each section in the same period.

FIGS. 10A-B are timing charts showing a driving sequence.

DETAILED DESCRIPTION

Figure 1:
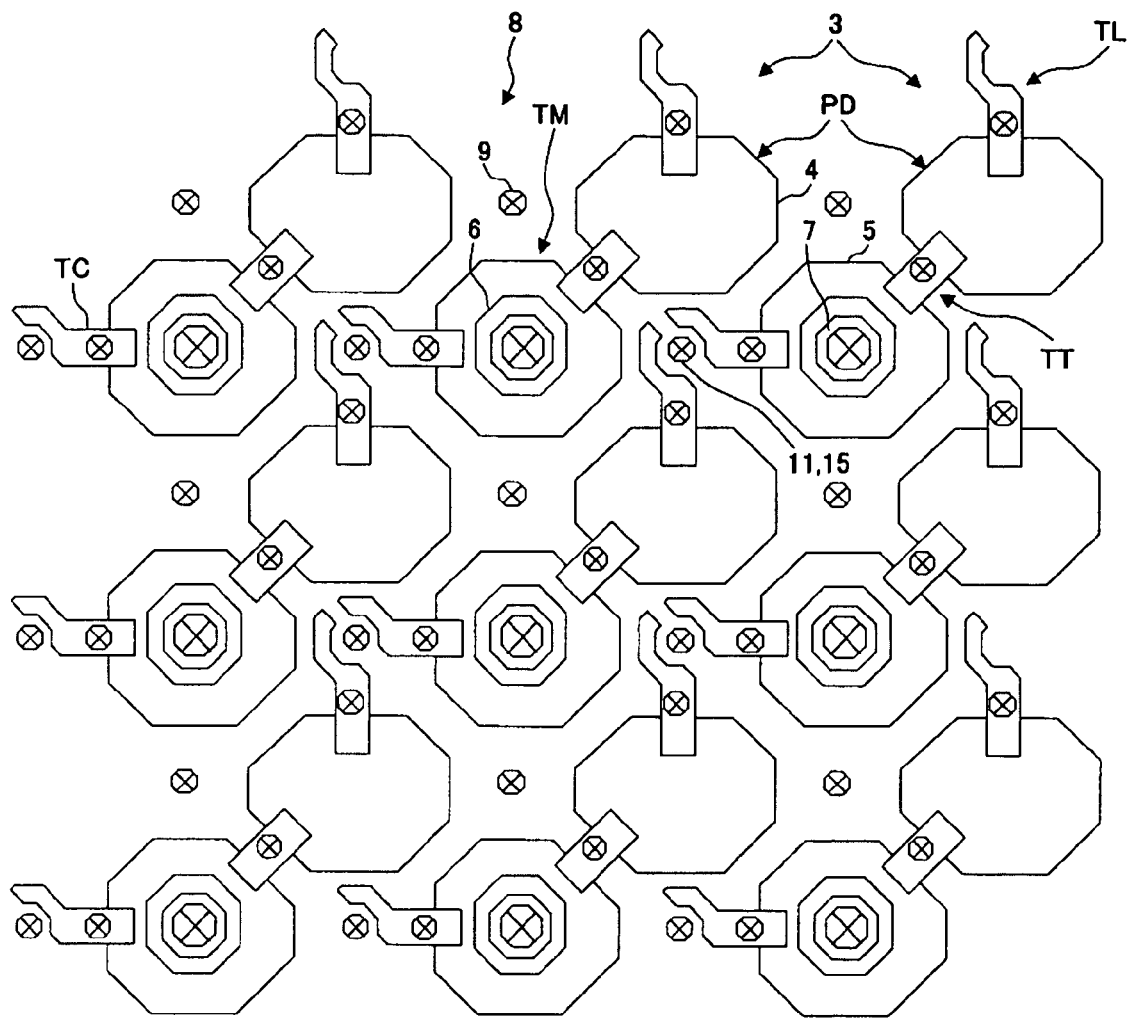
FIG. 1 is a plan view showing the planar shape of a solid state imaging device of a first embodiment of the present invention.
Figure 2:
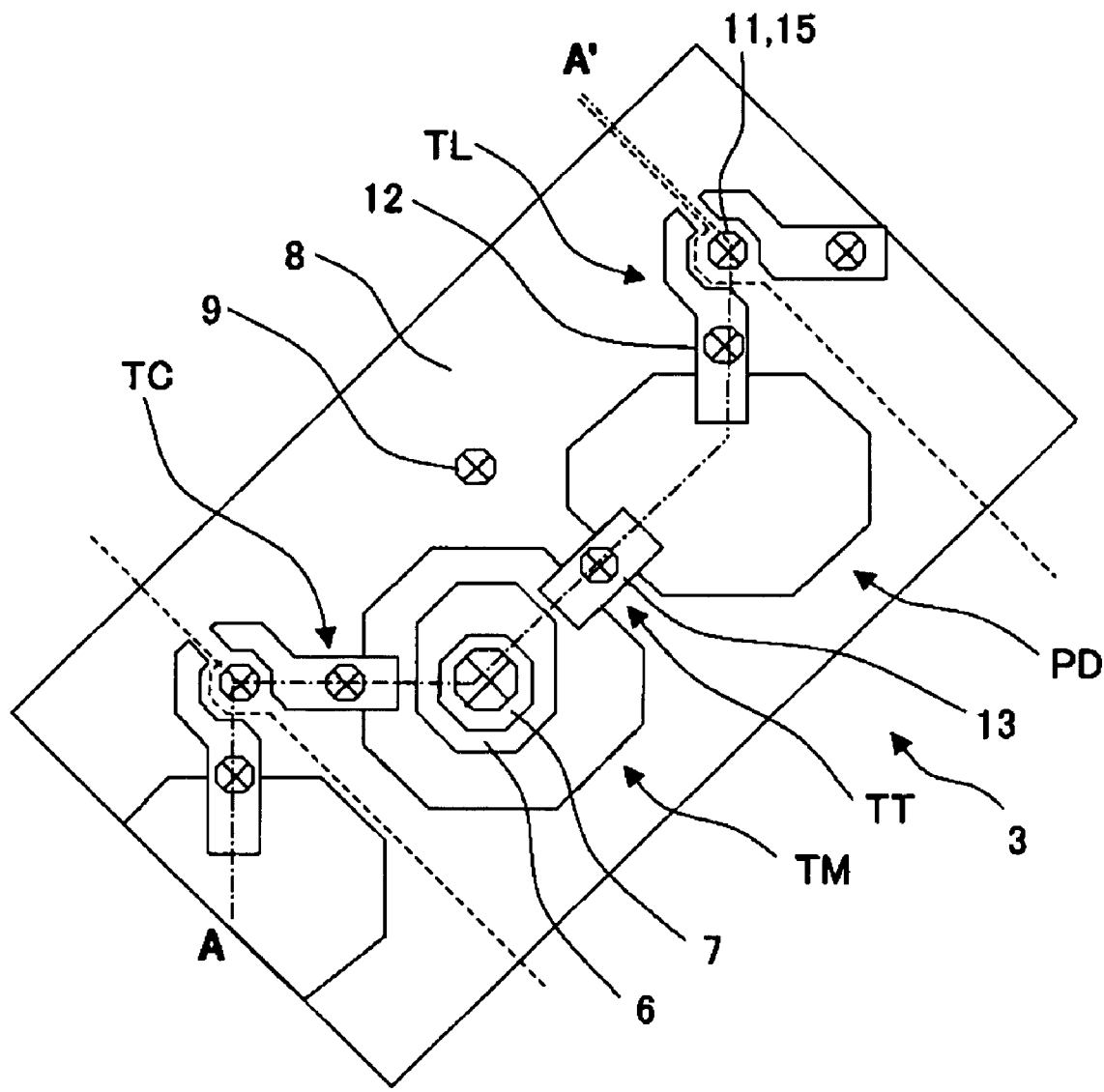
FIG. 2 is a plan view showing the planar shape of one cell of FIG. 1.
Figure 3:
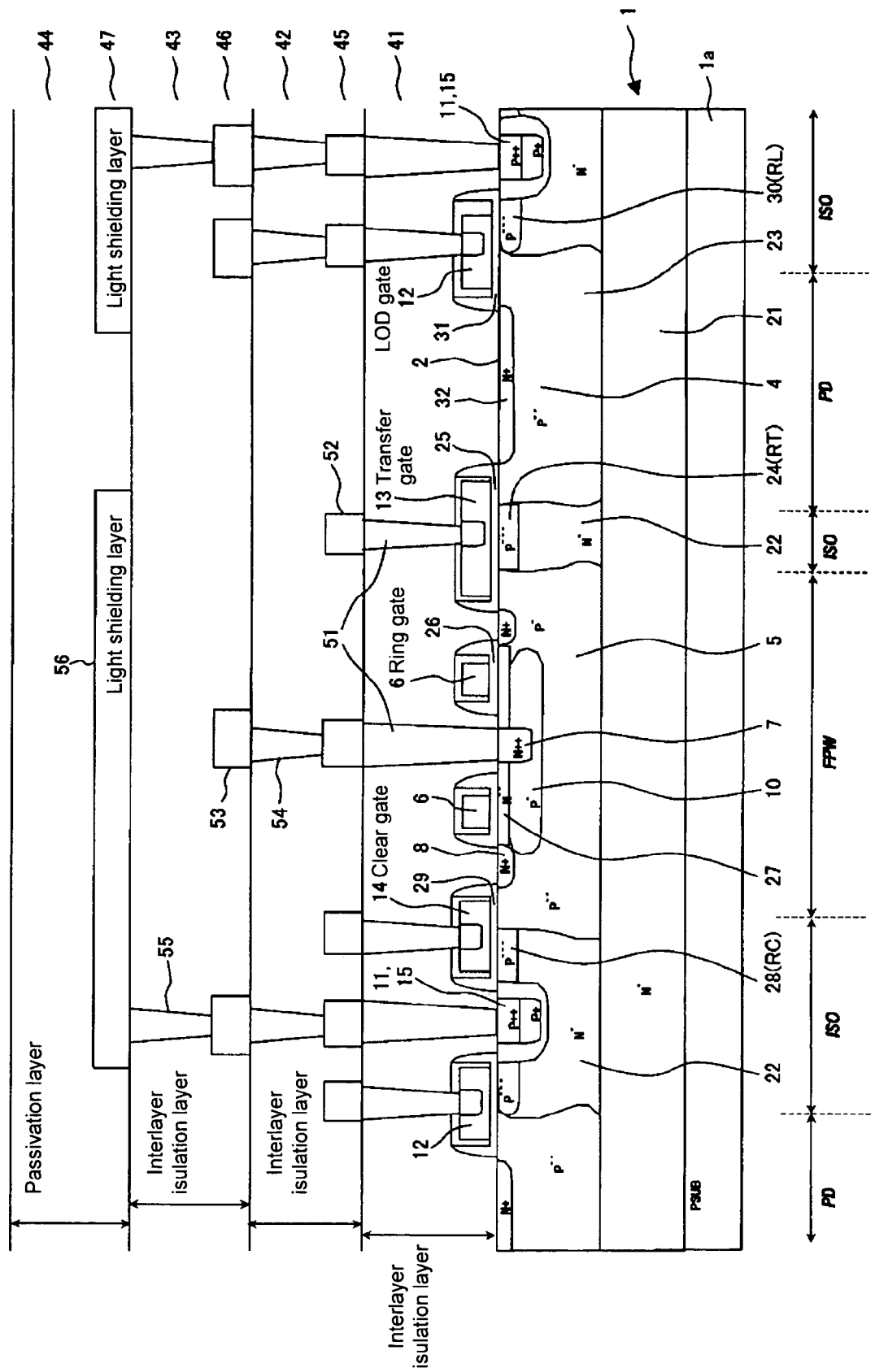
FIG. 3 is a cross-sectional view showing the cross-section cut along the A-A' line of FIG. 2.
Figure 4:
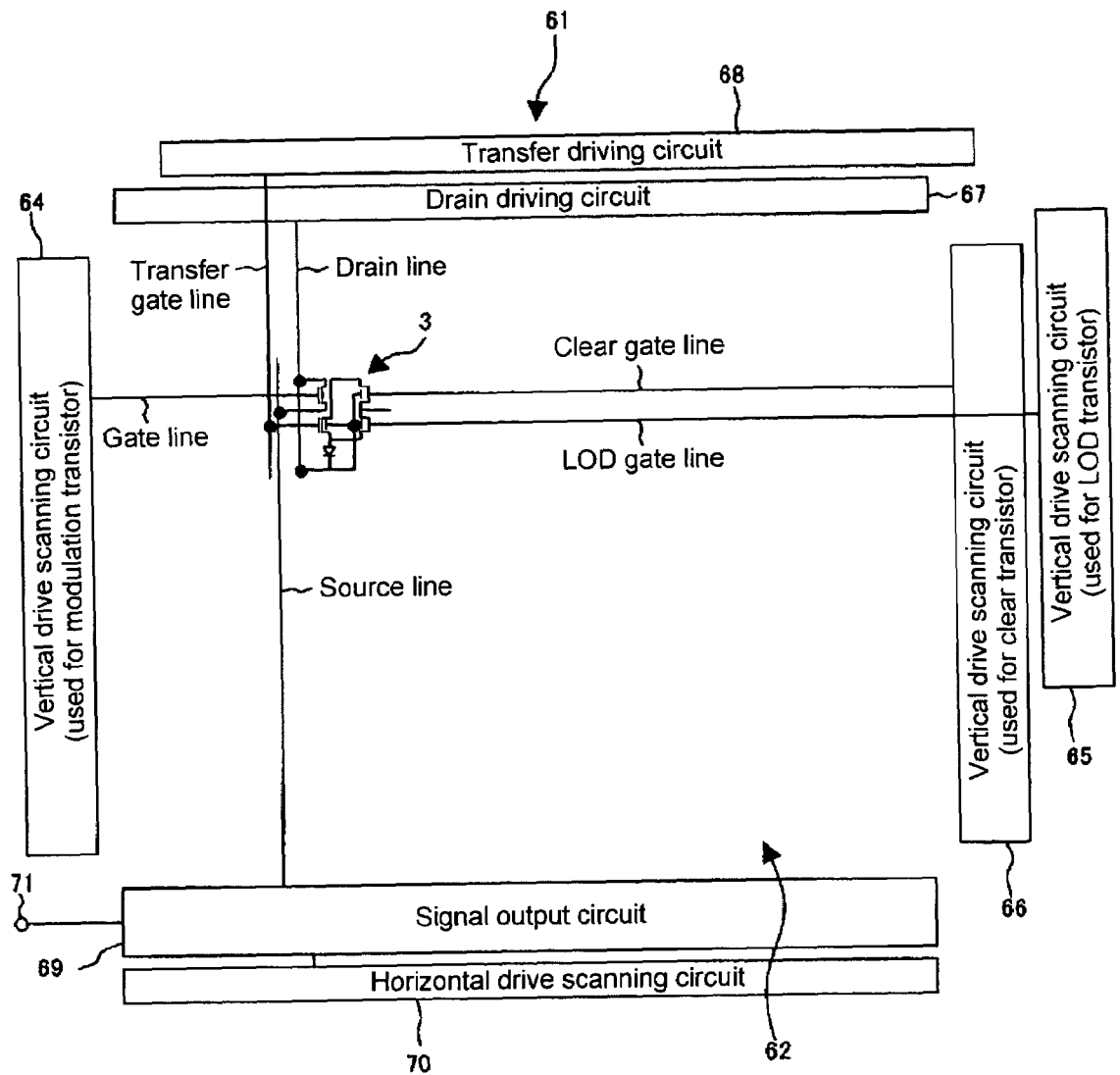
FIG. 4 is a block diagram showing the whole structure of the element.
Figure 8:
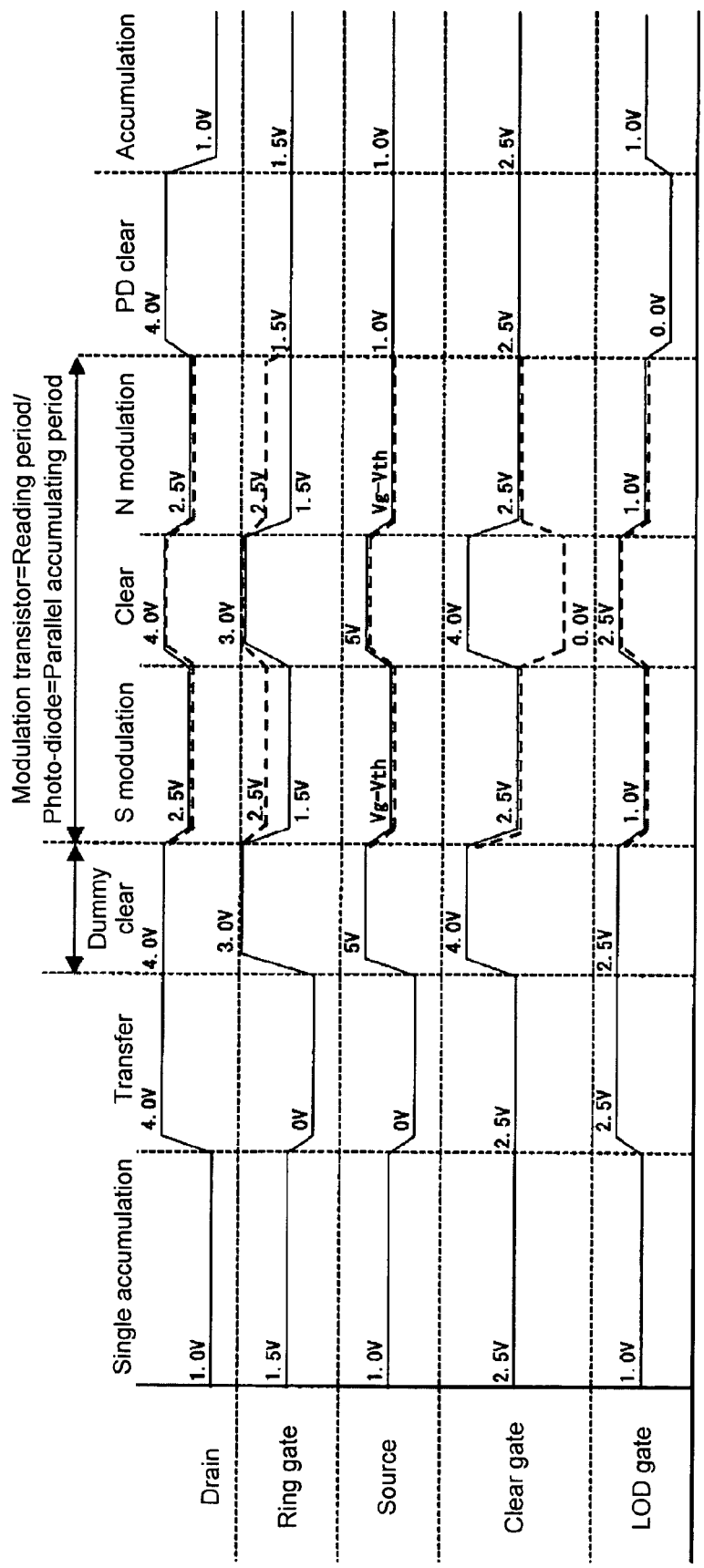
FIG. 8 is a diagram showing changes of the driving voltage in each period in the driving sequence.
Figure 9:
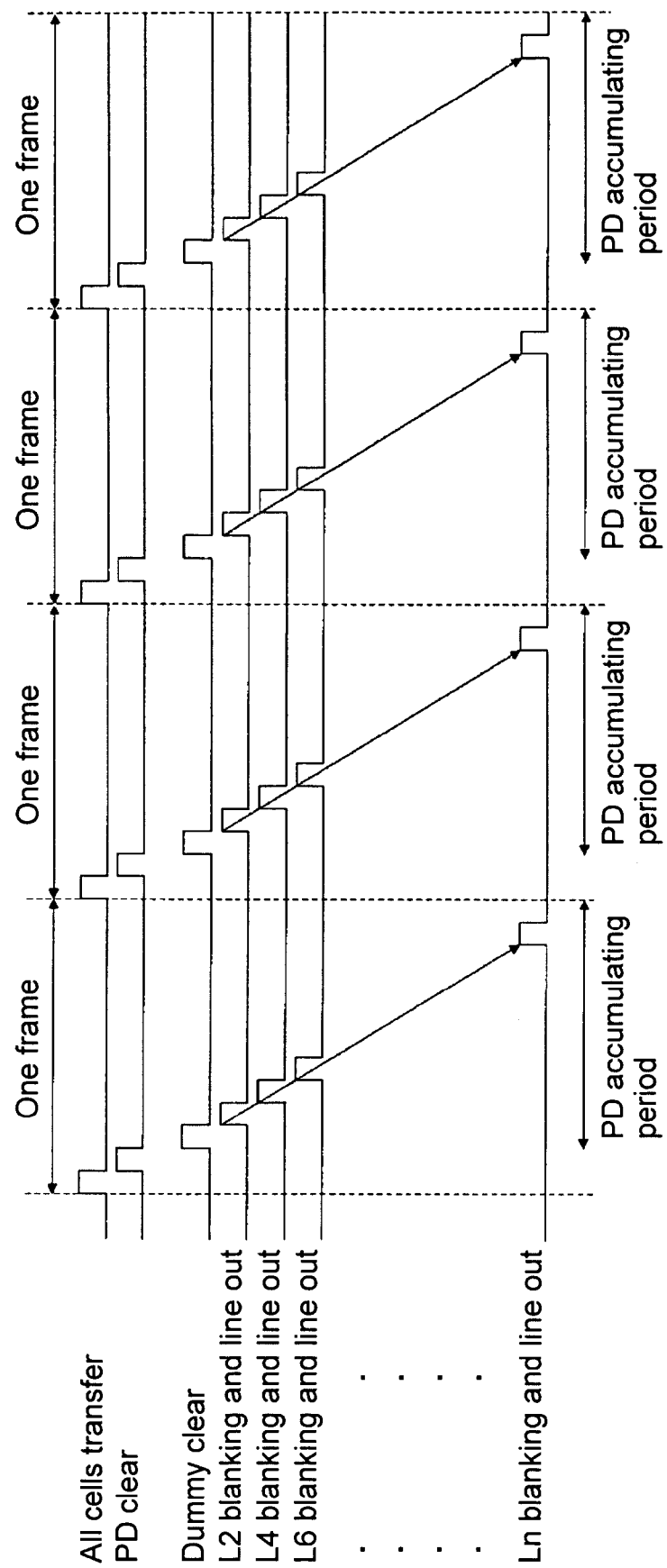
FIG. 9 is a timing chart showing a driving sequence.
Figure 11:
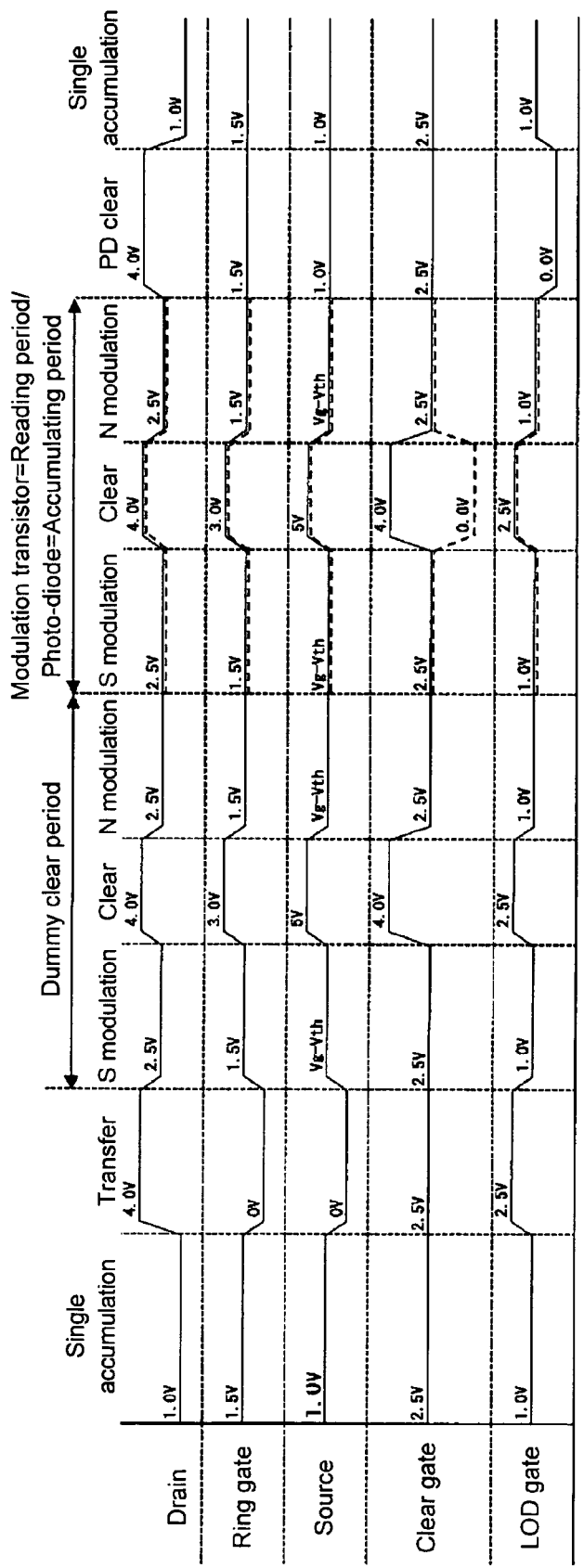
FIG. 11 is a diagram showing other control in a dummy clear period.
Figure 12:
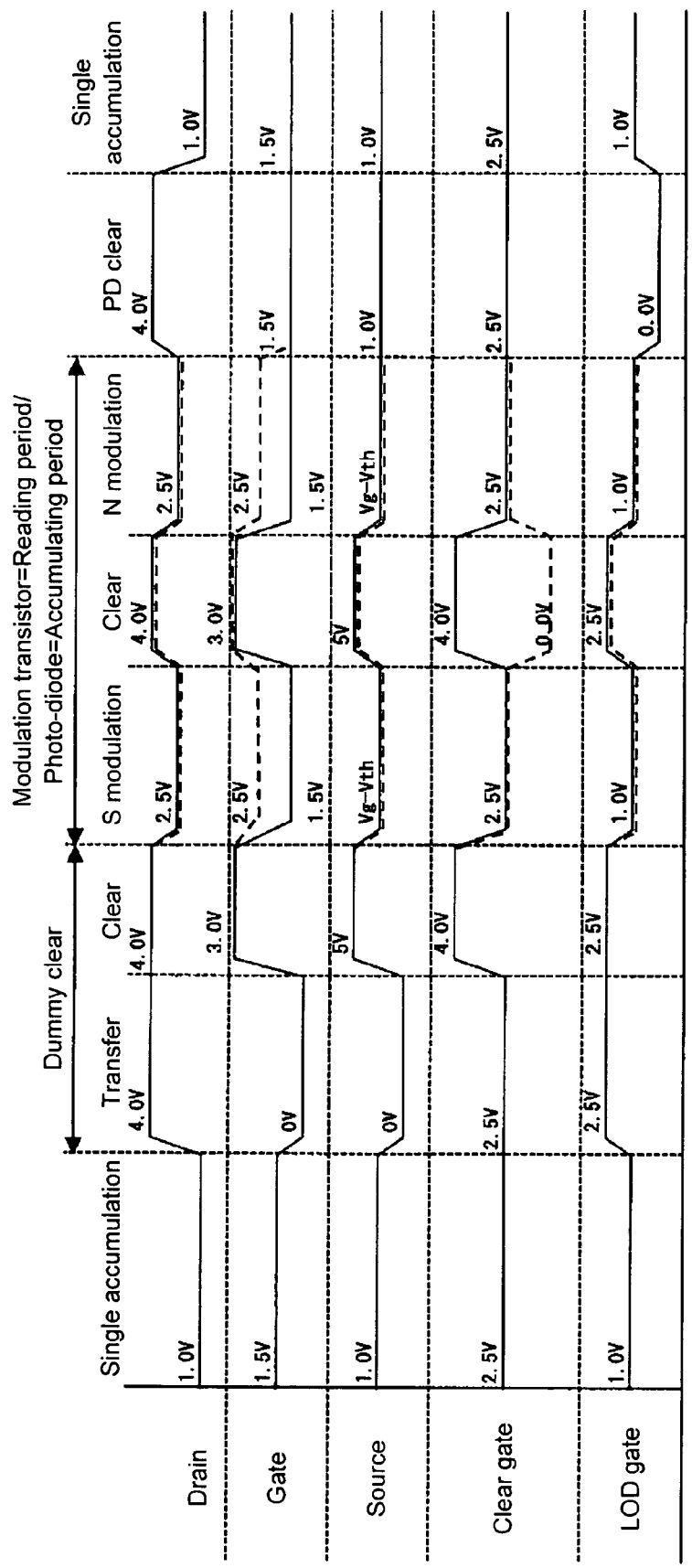
FIG. 12 is a diagram showing other control in the dummy clear period.

Hereinafter, embodiments of the present invention will be described in detail with reference to accompanying drawings. FIG. 1 through FIG. 12 are related to a first embodiment of the present invention, and FIG. 1 is a plan view showing a planar shape of a solid state imaging device of the embodiment, FIG. 2 is a plan view showing a planar shape of one cell of FIG. 1, and FIG. 3 is a cross-sectional view showing a cross-section cut along the A-A' line of FIG. 2. FIG. 4 is a block diagram showing the whole structure of the element, and FIG. 5 is an equivalent circuit diagram of a sensor cell. FIG. 6 is a timing chart for illustrating the outline of each driving period in the embodiment. FIG. 7 is a diagram showing potential relationship for each driving period, and FIG. 8 is a diagram showing changes of the driving voltage for each period in the driving sequence. FIG. 9 and FIG. 10 are timing charts showing driving sequences. FIG. 11 and FIG. 12 are diagrams showing other controls in the dummy clear period.

The solid state imaging device of the present embodiment includes the photoelectric conversion element, the accumulation well, the modulation well, and the modulation transistor. In the present embodiment, the photoelectric conversion element is a photo-diode. The accumulation well is provided in a photoelectric conversion element formation region and accumulates electric charges (hereinafter, referred to as photo-generated electric charges) generated by the photoelectric conversion element. The modulation well is provided in the modulation transistor formation region, and stores the photo-generated electric charges transferred from the accumulation well. The threshold of the modulation transistor is modulated by the photo-generated electric charges stored in the modulation well, based on which the modulation transistor outputs the pixel signal.

Moreover, the solid state imaging device of the present embodiment includes a photo-generated electric charge transfer channel and a transfer control element. The photo-generated electric charge transfer channel is provided between the accumulation well and the modulation well. The photo-generated electric charges are transferred from the accumulation well to the modulation well through the photo-generated electric charge transfer channel. The transfer control element controls the potential barrier of the photo-generated electric charge transfer channel, and moves photo-generated electric charges to the modulation well from the accumulation well. In the present embodiment, the transfer control element is a transfer transistor. The accumulation well and the modulation well are independently separated in terms of potential by the transfer control element. Accordingly, the accumulating period and the reading period (hereinafter, also referred to as a blanking period) can be set within the same period, and consequently the frame rate can be increased.

Furthermore, the solid state imaging device of the present embodiment includes a residual electric charge discharging channel, a contact region for discharging residual electric charges, and a residual electric charge discharging control element. The residual electric charge discharging channel is provided between the modulation well and the contact region for discharging residual electric charges, and provided approximately horizontally along the substrate surface. The residual electric charge discharging channel is electrically coupled to a wiring layer provided on the substrate through the contact region for discharging residual electric charges. Electric charges remaining in the modulation well (hereinafter, referred to as residual electric charges) are transferred to the contact region for discharging residual electric charges from the modulation well through the residual electric charge discharging channel. The contact region for discharging residual electric charges is formed inside the residual electric charge discharging channel. The residual electric charge discharging control element controls the potential barrier of the residual electric charge discharging channel, and discharges the residual electric charge from the modulation well to the wiring layer. In the present embodiment, the residual electric charge discharging control element is a clear transistor. The residual electric charges are not directly discharged vertically downward to the substrate from the modulation well. That is, the residual electric charges are displaced approximately horizontally along the substrate surface, namely in the substrate lateral direction, and are then discharged to the wiring layer formed on the substrate. Accordingly, design flexibility of the potential in the modulation transistor formation region can be improved.

In this case, the present embodiment makes carrier leakage uniform in all the pixels by suitably setting up the period for discharging residual electric charges, thereby improving the picture quality.

Structure of Sensor Cell

The solid state imaging device according to the present embodiment has a sensor cell array constituted by arranging sensor cells, which are unit pixels, in a matrix form, as will be described later. Each sensor cell accumulates photo-generated electric charges generated corresponding to incident light, and outputs the pixel signal with a level based on the accumulated photo-generated electric charges. The picture signal of one screen is obtained by arranging the sensor cells in a matrix form.

First, the structure of each sensor cell will be described with reference to FIG. 1 through FIG. 3. FIG. 1 shows a sensor cell with 3 horizontal pixels×3 vertical pixels, and FIG. 2 shows one sensor cell. In addition, one sensor cell is a region shown with the dashed lines of FIG. 2. In addition, the present embodiment shows an example using holes as photo-generated electric charges. In the case of using electrons as photo-generated electric charges, the same can be constructed. Moreover, FIG. 3 shows a cross-sectional structure of the cell cut along the A-A' line of FIG. 2.

As shown in the plan views of FIG. 1 and FIG. 2, the photo-diode PD and the modulation transistor TM are adjacently formed in a sensor cell 3 which is a unit pixel. As for the modulation transistor TM, an N channel depletion MOS transistor is used, for example. The unit pixel has an almost rectangular shape, each side of which is inclined to the row or line direction of the sensor cell array.

In the photo-diode PD formation region (PD of FIG. 3), which is a photoelectric conversion element formation region, an opening region 2 is formed on the surface of the substrate 1, and an accumulation well 4, which is a P type well with a region wider than the opening region 2, is formed in the relatively shallow position of the substrate 1 surface. The modulation well 5 which is a P type well is formed in a modulation transistor TM formation region (FPW of FIG. 3) with a predetermined space apart from this accumulation well 4.

On the modulation well 5, a ring-shaped gate (ring gate) 6 is formed in the substrate 1 surface, and a source region 7 which is a high concentration N type region is formed in the region near the substrate 1 surface of the center opening portion of the ring gate 6. An N type drain region 8 is formed in the surroundings of the ring gate 6. A drain contact region 9 of an N$^+$ layer is formed in a predetermined position of a drain region 8 near the substrate 1 surface.

The modulation well 5 controls the threshold voltage of the channel of the modulation transistor TM. In the modulation well 5, a carrier pocket 10 (FIG. 3) which is a P type high concentration region under the ring gate 6 is formed. The modulation transistor TM is constituted by the modulation well 5, the ring gate 6, the source region 7, and the drain region 8, and the threshold voltage of the channel changes corresponding to the electric charges accumulated in the modulation well 5 (carrier pocket 10).

A depletion region (not shown) is formed in the boundary region of an N type well 21, which will be described later, and the P type accumulation well 4, which are formed on the substrate 1 under the opening region 2 of the photo-diode PD, and photo-generated electric charges generated by incident light through the opening region 2 are generated in this depletion region. In the present embodiment, the photo-generated electric charges generated are accumulated in the accumulation well 4.

The electric charges accumulated in the accumulation well 4 are transferred to the modulation well 5, and are stored in the carrier pocket 10. Accordingly, the source potential of the modulation transistor TM becomes the one corresponding to the amount of the electric charges transferred to the modulation well 5, i.e., to the incident light upon the photo-diode PD.

A contact region (hereinafter, referred to as an OD contact region) 11 for discharging unwanted electric charges that will not contribute to the picture signal (hereinafter, referred to as unwanted electric charges), including the electric charges that overflow from the accumulation well 4, out of the photo-generated electric charges accumulated in the accumulation well 4, is formed by a high concentration P type diffusion layer in the substrate 1 surface near the accumulation well 4. On the substrate 1 surface between this OD contact region 11 and the accumulation well 4 region, an LOD gate 12 of a lateral over flow drain (hereinafter, referred to as LOD) transistor TL for forming a channel RL for the unwanted electric charges (hereinafter, referred to as unwanted electric charge discharging channel) including the electric charges that overflow between the OD contact region 11 and the accumulation well 4 region is formed. In addition, one end of the LOD gate 12 two-dimensionally hangs over the accumulation well 4 region.

By providing the LOD transistor TL as an unwanted electric charge discharging control element, the potential barrier between the OD contact region 11 and the accumulation well 4 can be controlled, and thus unwanted electric charges can be discharged through the wiring on the substrate from the OD contact region 11 through the LOD transistor TL.

In the present embodiment, the transfer transistor TT as the transfer control element is formed between the accumulation well 4 and the modulation well 5. The transfer gate 13 of the transfer transistor TT is formed on the substrate 1 surface of the channel RT between the accumulation well 4 and the modulation well 5 (hereinafter, simply referred to the transfer channel). The electric charges transfer from the accumulation well 4 to the modulation well 5 can be controlled by controlling the potential barrier of the transfer channel RT by the transfer transistor TT.

Moreover, in the present embodiment, in the substrate surface near of the modulation well 5, a contact region 15 for discharging by a high concentration P type diffusion layer (hereinafter, referred to as discharging contact region) is formed. On the substrate 1 surface between this discharging contact region 15 and the modulation well 5 region, a clear gate 14 of a clear transistor TC for controlling the potential barrier of the channel RC between the discharging contact region 15 and the modulation well 5 region (hereinafter, referred to as residual electric charge discharging channel) is formed. In addition, as for the clear gate 14, one end thereof two-dimensionally hangs over the modulation well 5 region.

In addition, the LOD transistor TL does not affect the discharge of the residual electric charges, which is a special feature of the present embodiment, therefore, the LOD transistor TL can be omitted in this sense.

Cross-Section of Sensor Cell

Furthermore, with reference to FIG. 3, the cross-sectional structure of the sensor cell 3 will be described in detail. Incidentally, the subscripts. "−" and "+" of N and P in FIG. 3 indicate the state of a portion with lighter impurity concentration (subscript −−−) to heavier impurity concentration (subscript +++), depending on the number of the subscript.

FIG. 3 shows one unit pixel (cell) and a photo-diode PD formation region (PD) of a pixel adjacent to this cell. One cell includes the photo-diode PD formation region (PD) and the modulation transistor TM formation region (FPW). An isolation region (ISO) is formed between the photo-diode PD formation region and the modulation transistor TM formation region in the cell and between adjoining cells.

The N type well 21 of N$^-$ is formed at a relatively deep position of the substrate 1 in the entire P type substrate 1a. An isolation region 22 used for isolating elements by an N$^-$ layer is formed on this N type well 21. A P$^{--}$ layer 23 is formed in all the elements other than the isolation region 22 on the N type well 21.

The P$^{--}$ layer 23 in the photo-diode PD formation region functions as the accumulation well 4. The P$^{--}$ layer 23 in the modulation transistor TM formation region functions as the modulation well 5, and in this modulation well 5, the carrier pocket 10 is formed by P$^-$ diffusion.

The transfer transistor TT is formed on the substrate surface side in the isolation region 22 between the photo-diode PD formation region, and the modulation transistor TM formation region in the cell. The transfer transistor TT is constituted by forming a P$^{---}$ diffusion layer 24, which constitutes a channel on the substrate surface, and the transfer gate 13 on the substrate surface through a gate insulation layer 25. This P$^{---}$ diffusion layer 24, being coupled to the accumulation well 4 and the modulation well 5, constitutes the transfer channel RT, and the potential barrier of this transfer channel RT is controlled corresponding to the applied voltage to the transfer gate 13.

In the modulation transistor TM formation region, the ring gate 6 is formed in the substrate surface through a gate insulation layer 26. and N⁻⁻ diffusion layer 27 which constitutes a channel is formed in the substrate surface under the ring gate 6. An N⁺⁺ diffusion layer is formed in the substrate surface of the center of the ring gate 6 to constitute the source region 7. Moreover, an N⁺ diffusion layer is formed in the substrate surface in the periphery of the ring gate 6 to constitute the drain region 8. The N⁻⁻ diffusion layer 27 which constitutes a channel is coupled to the source region 7 and the drain region 8.

A discharging contact region 15 and an OD contact region 11 are formed, at the substrate surface side, in the isolation region 22 between the photo-diode PD formation regions and the modulation transistor TM formation regions of adjoining cells. In the present embodiment, these discharging contact region 15 and the OD contact region 11 are combined to be used, however, these may be constructed separately. The discharging and the OD contact regions, 15 and 11, are obtained by forming a P⁺⁺ diffusion layer in the substrate surface.

Then, a clear transistor TC is formed at the substrate surface side between the modulation transistor TM formation region, and the discharging and OD contact regions 15 and 11. The clear transistor TC is constituted by forming a P⁻⁻⁻ diffusion layer 28 which constitutes a channel in the substrate surface between the modulation transistor TM formation region, and the discharging and OD contact regions 15 and 11, and by forming the clear gate 14 in the substrate surface through a gate insulation layer 29. This P⁻⁻⁻ diffusion layer 28, being coupled to the modulation well 5 and the discharging and OD contact regions 15 and 11, constitutes the residual electric charge discharging channel RC, and the potential barrier of this residual electric charge discharging channel RC is controlled corresponding to the applied voltage to the clear gate 14.

The LOD transistor TL is formed at the substrate surface side between the photo-diode PD formation region, and the discharging and OD contact regions 15 and 11. The LOD transistor TL is constituted by forming a P⁻⁻⁻ diffusion layer 30 which constitutes a channel in the substrate surface between the photo-diode PD formation region, and the discharging and OD contact regions 15 and 11, and by forming the LOD gate 12 through a gate insulation layer 31 in the substrate surface. This P⁻⁻⁻ diffusion layer 30, being coupled to the accumulation well 4 and the discharging and OD contact regions 15 and 11, constitutes the unwanted electric charge discharging channel RL, and the potential barrier of this unwanted electric charge discharging channel RL is controlled corresponding to the applied voltage to the LOD gate 12.

In addition, an N⁺ diffusion layer 32, as a pinning layer, is formed at the substrate surface side of the photo-diode PD formation region.

A lower layer wiring layer 45 is formed in the substrate surface through an interlayer insulation layer 41, and an upper layer wiring layer 46 is formed through an interlayer insulation layer 42 on the lower layer wiring layer 45. Furthermore, on the upper layer wiring layer 46, a light shielding layer 47 is formed through an interlayer insulation layer 43, and a passivation layer 44 is formed on the light shielding layer 47. The clear gate 14, the LOD gate 12, the transfer gate 13, the discharging and OD contact regions 15 and 11, and the source region 7 are electrically coupled to each wiring 52 of the lower layer wiring layer 45 through a contact hole 51 opened in the interlayer insulation layer 41. In addition, each of the wirings 52 and 53 of the lower layer and the upper layer wiring layers 45 and 46 is made of metal material, such as aluminum.

Furthermore, each wiring 52 of the lower layer wiring layer 45 and each wiring 53 of the upper layer wiring layer 46 are electrically coupled through the contact hole 54 formed in the interlayer insulation layer 42. Moreover, in the interlayer insulation layer 43, a contact hole 55 for coupling a light shielding layer 56 formed in the light shielding layer 47 and one wiring of the upper layer wiring layer 46 is opened, and the discharging and OD contact regions 15 and 11 are coupled to the light shielding layer 56 through the lower layer and the upper layer wiring layers 45 and 46.

In the present embodiment, the transfer transistor TT, the clear transistor TC, and the LOD transistor TL are controlled independently, and then the potential barriers of the transfer channel RT, the residual electric charge discharging channel RC and the unwanted electric charge discharging channel RL are controlled. Then describing the ups and downs (rising and lowering) of the potential of these channels, RT, RC and RL with reference to the hole potential, in the accumulating period, the potentials of the transfer channel RT, the residual electric charge discharging channel RC and the unwanted electric charge discharging channel RL are set high enough to allow the photo-generated electric charges (in case of hole) to be accumulated, while the potentials of the residual electric charge discharging channel RC and the unwanted electric charge discharging channel RL are set lower than the potential of the transfer channel RT. In addition, hereinafter, the ups and downs of the potential will be described with reference to the potential of a hole, not to the potential of an electron.

Circuit Configuration of Entire Device

Next, the circuit configuration of the entire solid state imaging device according to the present embodiment will be described with reference to FIG. 4.

A solid state imaging device 61 has a sensor cell array 62 including the sensor cell 3 of FIG. 1 through FIG. 3, and circuits 64 through 70 which drive each sensor cell 3 in the sensor cell array 62. The sensor cell array 62 is constituted by arranging the cell 3, in a matrix form. The sensor cell array 62 includes such as the cell 3 of 640×480, and a region (OB region) for the optical black (OB). When the OB region is included, the sensor cell array 62 is composed of cells 3 of 712×500 or the like.

Equivalent Circuit of Sensor Cell

Figure 5A:
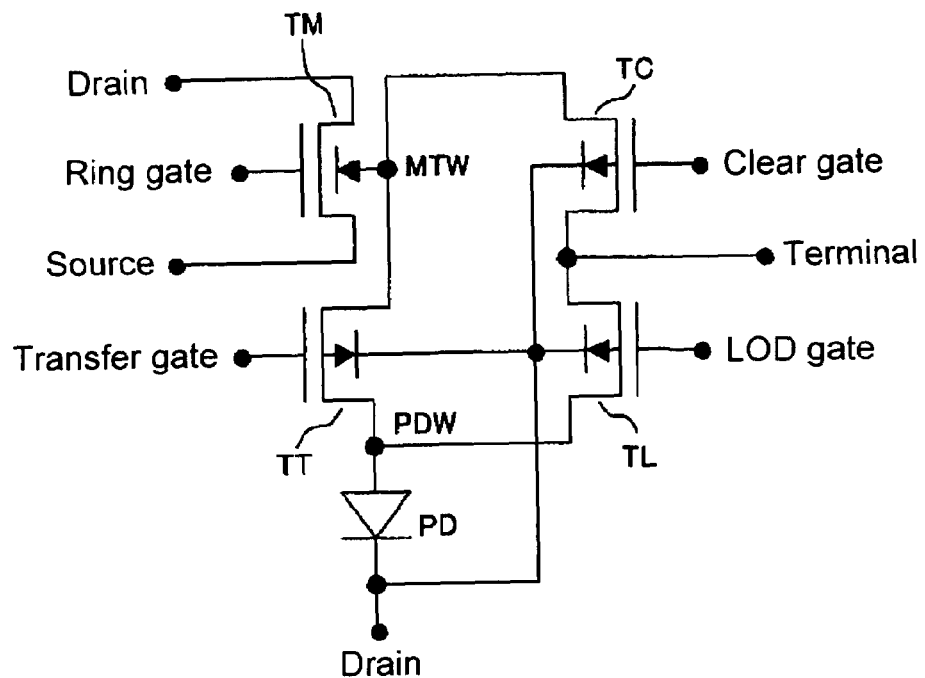
FIGS. 5A-B are equivalent circuit diagrams of a sensor cell.
Figure 5B:
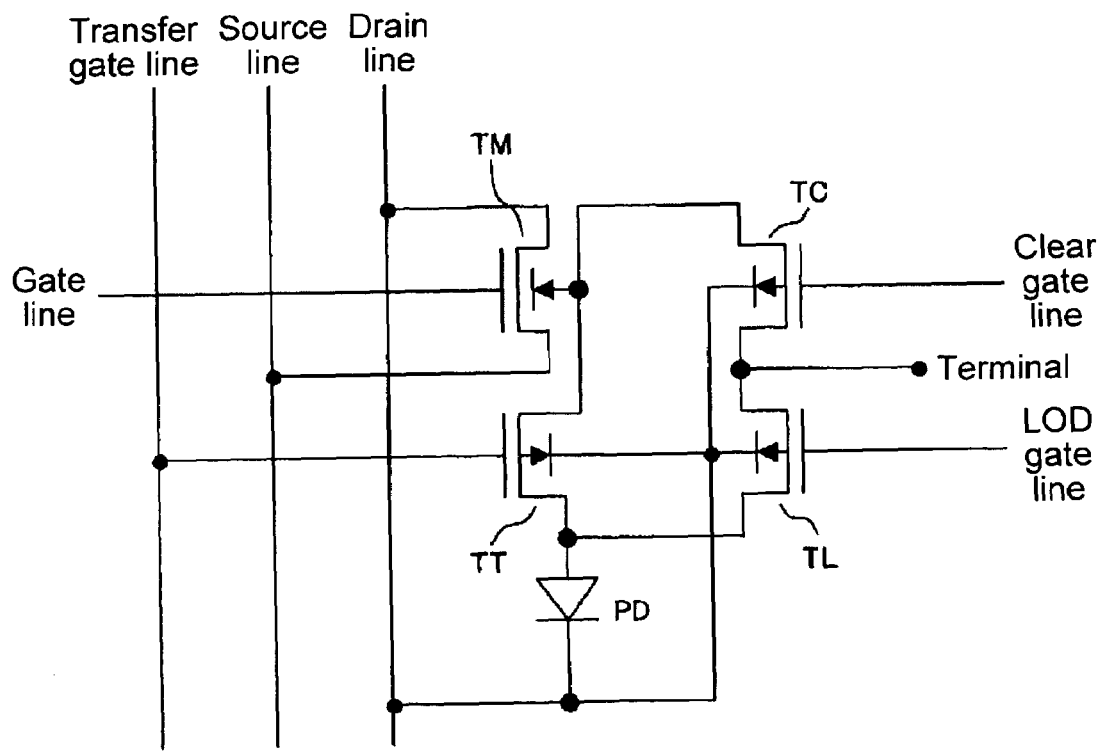
Figure 6:
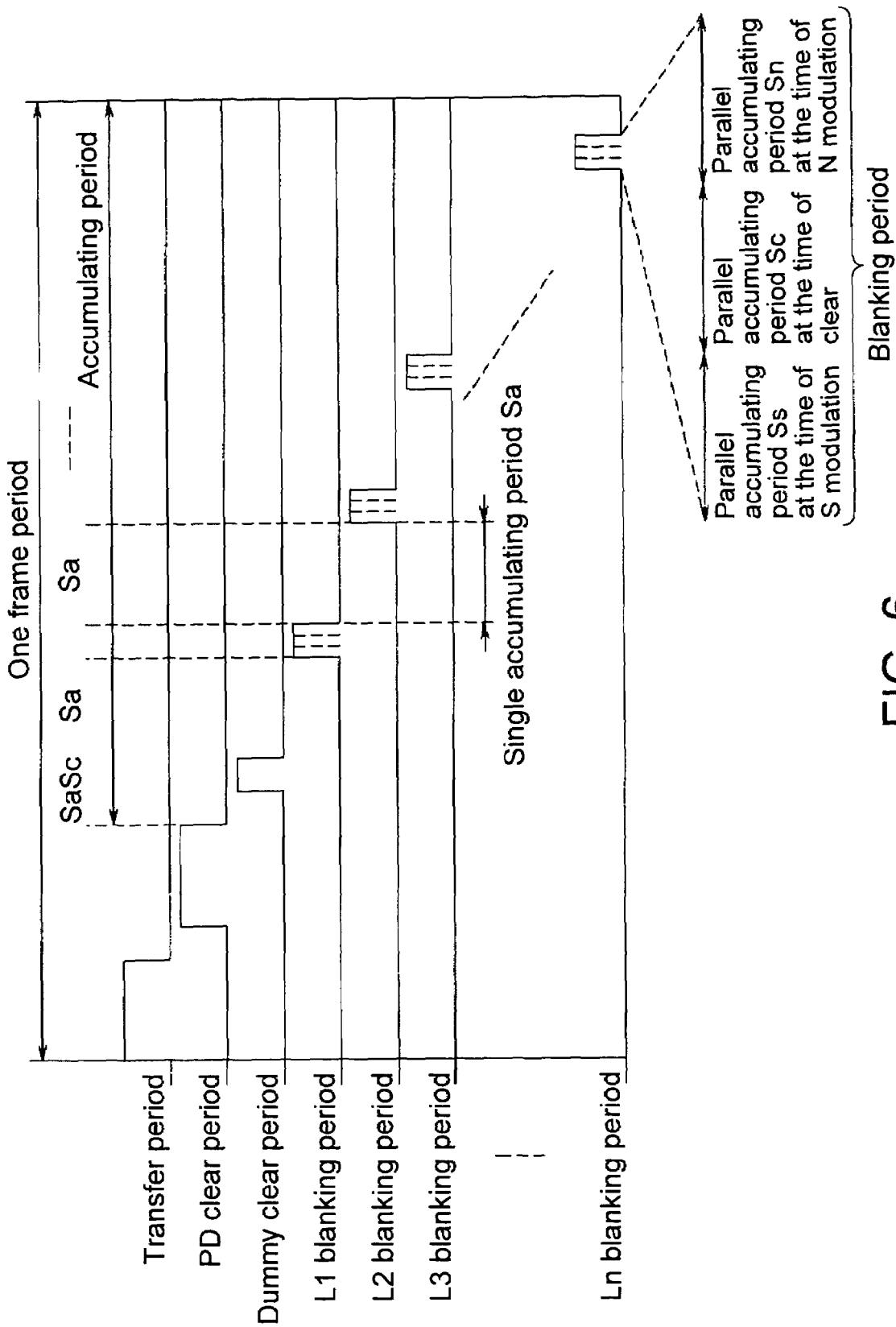
FIG. 6 is a timing chart illustrating the outline of each driving period in the first embodiment.

FIG. 5 shows the specific circuit configuration of each sensor cell in FIG. 4. FIG. 5(A) shows an equivalent circuit of the sensor cell, and FIG. 5(B) shows coupling between the sensor cell and each signal line.

Each sensor cell 3 includes the photo-diode PD which performs photoelectric conversion, the modulation transistor TM for detecting the optical signal for reading, and the transfer transistor TT which controls transfer of photo-generated electric charges. The photo-diode PD generates the electric charges (photo-generated electric charges) corresponding to incident light, and accumulates the generated electric charges to the accumulation well 4 (corresponding to a coupling point PDW in FIG. 5). The transfer transistor TT transfers the photo-generated electric charges accumulated in the accumulation well 4 in the accumulating period to the carrier pocket 10 in the modulation well 5 (corresponding to a coupling point TMW in FIG. 5) used for the threshold modulation of the modulation transistor TM in the transfer period and stores.

With respect to the modulation transistor TM, that the photo-generated electric charges are stored in the carrier pocket 10 is equivalent to that the back gate bias thereof is changed, and the threshold voltage of the channel changes corresponding to the amount of the electric charges in the carrier pocket 10. Accordingly, the source voltage of the modulation transistor TM becomes the one corresponding to the electric charges in the carrier pocket 10, i.e., the brightness of the incident light upon the photo-diode PD.

Between the modulation well 5 and a terminal, the clear transistor TC as the residual electric charge discharging control element is arranged. The clear transistor TC controls the potential barrier between the modulation well 5 and the terminal, and discharges the electric charge remaining in the modulation well 5 of the cell 3, after completion of the reading of the pixel signal. On the other hand, between the accumulation well 4 and the terminal, a LOD transistor TL as the unwanted electric charge discharging control element is arranged. The LOD transistor TL controls the potential barrier between the accumulation well 4 and the terminal, and discharges the unwanted electric charge in the accumulation well 4 to the terminal.

Thus, each cell 3 exhibits operations of accumulation, transfer, reading, and discharging or the like by applying a driving signal to the ring gate 6, the source and the drain of the modulation transistor TM, the transfer gate 13 of the transfer transistor TT, the clear gate 14 of the clear transistor TC, and the LOD gate 12 of the LOD transistor TL. As shown in FIG. 4, a signal is provided to each part of the cell 3 from vertical drive scanning circuits 64 through 66, a drain driving circuit 67 and a transfer driving circuit 68. The reading means the clear means, and the dummy clear means are constituted by these vertical drive scanning circuits 64 through 66, the drain driving circuit 67, and the transfer driving circuit 68.

FIG. 5(B) shows the coupling to each of the scanning circuits 64 through 66, each of the driving circuits 67 and 68, and the signal output circuit 69, for one of the cell 3 arranged in a matrix form. The coupling condition of other cells is the same. Each cell 3 is provided corresponding to the intersection of a plurality of source lines horizontally arranged and a plurality of gate lines vertically arranged with respect to the sensor cell array 62. In each cell 3 of each line arranged in the horizontal direction, the ring gate 6 of the modulation transistor TM is coupled to a common gate line, and in each cell 3 of each row arranged in the vertical direction, the source of the modulation transistor TM is coupled to a common source line.

By providing an ON signal to one of the plurality of gate lines, each cell commonly coupled to the gate line to which the ON signal is provided is simultaneously selected, and the pixel signal is outputted through each source line from each source of these selected cells. The vertical drive scanning circuit 64 provides an ON signal to the gate line by sequentially shifting in one frame period. The pixel signal from each cell of the line to which the ON signal is provided is simultaneously read from the source line by one line portion, and is provided to the signal output circuit 69. The pixel signal for one line portion is sequentially outputted (line-out) for every pixel from the signal output circuit 69 by the horizontal drive scanning circuit 70.

In the present embodiment, the accumulation well 4 and the modulation well 5 are formed independently and separately in terms of the potential, and the transfer transistor TT which controls the potential barrier between the accumulation well 4 and the modulation well 5 can implement simultaneously the accumulation of the photo-generated electric charges by the photo-diode PD and the reading of the pixel signal by the modulation transistor TM. Control of the transfer transistor TT is carried out by providing a gate signal to the transfer gate 13 of each transfer transistor TT from the transfer driving circuit 68.

Moreover, in the present embodiment, as described above, the unwanted electric charge discharging channel RL of the accumulation well 4 and the residual electric charge discharging channel RC from the modulation well 5, which is adjacently arranged are set to mutually different channels. Then, by providing the LOD transistor TL and the clear transistor TC which control the potential barrier of these two channels, respectively, discharging of the unwanted electric charge from the accumulation well 4 and discharging of the residual electric charge from the modulation well 5 can be surely carried out in terms of potential. Control of the LOD transistor TL and the clear transistor TC is carried out by providing a gate signal to each of the LOD gate 12 or the clear gate 14 from the vertical drive scanning circuits 65 and 66, respectively. In addition, the drain driving circuit 67 provides a drain voltage to the drain of each modulation transistor TM.

Relationship Between Accumulating Period and Reading Period

FIG. 6 is a timing chart for illustrating each driving period in the present embodiment. In addition, FIG. 6 shows the driving sequence in the normal mode. In FIG. 6, L1, L2 and so on correspond to each line of the sensor cell array 62.

The accumulating period is set to a period common to all the cells, as will be described later. However, the reading is carried out for each line. The reading timing differs for each line, and the reading period (hereinafter, referred to as blanking period) for each line is shown as a pulse shape in FIG. 6.

Reading Period

The reading period (blanking period) comprises an S (signal) modulation period, a clear period, and an N (noise) modulation period in the present embodiment. A signal component and a noise component are read from the same cell to compare and remove the variation between cells 3 and various kinds of noises. During the S modulation period, an S modulation operation for reading the pixel signal based on the photo-generated electric charges accumulated in the modulation well 5 is carried out. During, the clear period, a clear operation for discharging the photo-generated electric charge remaining in the modulation well 5 through the residual electric charge discharging channel RC is carried out in order to read the noise component. During the N modulation period, in order to read the noise component from the modulation well 5, N modulation operation, which reads the pixel signal after the clear, is carried out.

Accumulating Period

In the present embodiment, a provision is made to carry out the accumulation operation (parallel accumulation operation) to the accumulation well 4 even in the blanking period. Namely, the S modulation period, the clear period, and the N modulation period during the blanking period each are, in terms of the accumulation, a parallel accumulating period Ss at the time of the S modulation, the parallel accumulating period Sc at the time of the clear, and a parallel accumulating period Sn at the time of the N modulation.

The accumulating period according to the present embodiment includes, besides a parallel accumulating period which is the same period as the blanking period, a single accumulating period Sa where a single accumulation operation is carried out. The pixel signal read in the blanking period is stored in a line memory (corresponding to the signal output circuit 69 of FIG. 4). The pixel signal for one line portion is sequentially outputted per pixel from this line memory, and the reading from each cell of the following line is carried out after the output of the line memory is completed. Therefore, the reading from the cell of the following line cannot be carried out until the output from the line memory is completed, and thus the single accumulating period Sa is set to a period (hereinafter, referred to as line-out period) required to transfer and output (line-out) the pixel signal from such a line memory.

Sequence in Frame

In the present embodiment, for example, as shown in FIG. 6, one frame period is constituted by cyclically repeating the single accumulating period Sa (same period as the line out period) and the parallel accumulating periods Ss, Sc, and Sn (same period as the blanking period), after the transfer period, the PD clear period and the dummy clear period, as will be described later. All the cells 3 of the sensor cell array 62 cyclically repeat operation of the single accumulating period Sa and the parallel accumulating periods Ss, Sc, and Sn. Then, only the period shown in the pulse shape of FIG. 6 among the parallel accumulating periods Ss, Sc, and Sn is set in the blanking period for each line, and the reading operation is carried out. In one frame period, the single accumulating period Sa and the blanking period are repeated a number of times based on the number of the lines.

Namely, one frame period has a blanking period of a number of the lines, and each line is respectively designated to the line (hereinafter, referred to as reading line) in which a reading of just one blanking period is carried out during one frame period. Each cell in the reading line is called a reading cell. Moreover, a line other than the reading line is called a non-reading line, and each cell in the non-reading line is called a non-reading cell.

In the single accumulating period Sa and the parallel accumulating periods Ss, Sc, and Sn, the photo-generated electric charges are successively accumulated in the accumulation well 4, as will be described later. As shown in FIG. 6, the time period from completion of the PD clear period to the completion of a frame period is the accumulating period, during which the photo-generated electric charges accumulated in the accumulation well 4 will be transferred from the accumulation well 4 to the modulation well 5 in the transfer period, which is the leading period of the following frame, shown in FIG. 6, and are stored. During the transfer period, all the cells perform the transfer operation as will be described later.

Next, the PD clear period, which is very short, is set up in order to discharge the photo-generated electric charges generated from the completion of the transfer period to the start of the accumulating period. In the PD clear period, unwanted electric charges are discharged from the accumulation well 4 of all the cells. In addition, the PD clear period is used for setting up the length of the accumulating period, and the PD clear period can be omitted in the normal mode.

Looking at a predetermined line, for example, in each cell in a line L1 as the reading cell at the modulation transistor TM side, during the blanking period as shown in FIG. 6, the S modulation operation, the clear operation, and the N modulation operation are carried out. At the same time, at the accumulation well 4 side, the parallel accumulation operation Ss at the time of the S modulation, the parallel accumulation operation Sc at the time of the clear, and the parallel accumulation operation Sn at the time of the N modulation are carried out. As for each cell of the line L1, during the period other than this blanking period, as for the non-reading cell, the single accumulation operation Sa, the parallel accumulation operation Ss at the time of the S modulation, the parallel accumulation operation Sc at the time of the clear, and the parallel accumulation operation Sn at the time of the N modulation are cyclically repeated.

Namely, in any cell, all the periods except for the transfer period, the PD clear period, and the dummy clear period are set as the single or the parallel accumulating period, and the parallel accumulation operation is also carried out especially during the blanking period of the reading cell. Then, the accumulated photo-generated electric charges are transferred to the modulation well 5 in the transfer period at the beginning of the following frame. Namely, the period from the completion of PD clear period (the completion of the transfer period in case that the PD clear period is omitted) of the preceding frame to the start of the transfer period is the accumulating period for each cell, and the pixel signal used for blanking is based on the photo-generated electric charges accumulated in the accumulating period of the preceding frame.

Potential

Next, with reference to FIG. 7, operation in the single accumulating period Sa, the transfer period, the S modulation period (parallel accumulating period Ss), the clear period (parallel accumulating period Sc), and the N modulation period (parallel accumulating period Sn) and PD clear period will be described based on the potential relationship. FIG. 7 is a diagram illustrating the potential relationship for each period, with the direction, where the hole potential becomes high, being the positive side. FIG. 7(A) shows the condition at the time of the single accumulation, FIG. 7(B) shows the condition at the time of the transfer, FIG. 7(C) shows the condition at the time of the S modulation or the N modulation (S/N modulation), FIG. 7(D) shows the condition at the time of the clear and FIG. 7(E) shows the condition at the time of the clear (PD clear) of the accumulation well 4 in a low-speed shutter mode and a high-speed shutter mode. The column on the left side of FIG. 7 shows the condition of the reading cell, and the column of the right side shows the condition of the non-reading cell. In addition, FIG. 7 shows the potential changes based on the electric charges, with a satin pattern. Moreover, as described above, whether each cell becomes either the reading cell or the non-reading cell is indicated by the pulse of FIG. 6.

Moreover, FIG. 8 shows changes of the driving voltage for each period. FIG. 8 shows the changes of the driving voltage for each period, and the actual driving sequence and the order of the period to set differ. FIG. 8 shows a setup of the driving voltage shown in FIG. 7 in time order (sequentially). In addition, as for the blanking period, in FIG. 8, the driving voltage of the reading cell is shown with the dashed line and the driving voltage of the non-reading cell is shown with the solid line.

FIG. 7 shows the potential relationship for each position, taking the position corresponding to the cutting line of each cell of FIG. 2 in the horizontal axis, and taking the potential with reference to the hole in the vertical axis. From the left side to the right side in FIG. 7, the potentials in the substrate at the positions of the discharging contact region (Sub), the clear gate (CG) 14 (residual electric charge discharging channel portion), one end of a carrier pocket (PKT) 10, the source (S), the other end of the carrier pocket (PKT) 10, a transfer gate (TX) 13 (transfer channel RT portion), the accumulation well region (PD), a LOD gate (LOD) 12 (unwanted electric charge discharging channels RL portion) and the OD contact region (substrate) are shown.

The potential of each part changes corresponding to the driving voltage. For example, if the source voltage and the drain voltage or the like are increased or decreased, the potential of the surroundings will increase or decrease as well. For example, the potential of the accumulation well 4 is influenced mainly by both the applied voltages to the source and to the drain of the modulation transistor TM. Moreover, the potential of the modulation well 5 will be increased or decreased mainly corresponding to the ups and downs of the gate voltage of the modulation transistor TM.

In the present embodiment, the same drive is carried out to all the cells in the single accumulating period Sa shown in FIG. 7(A). As also shown in FIG. 8, in the single accumulating period Sa shown in FIG. 7 (A) 0.0V is applied to the ring gate (RG) 6, 2.5V is applied to the transfer gate (TX) 13, 2.5V is applied to the clear gate 14, 2.0V is applied to the LOD gate 12, 1.0V is applied to the drain D, and 1.0V is applied to the source. The drain voltage is set to a relatively low value.

In the single accumulating period, the potential barrier of the transfer channel RT between the accumulation well 4 and the modulation well 5 is made high enough by the transfer transistor TT. Moreover, the potential barrier of the unwanted electric charge discharging channel RL between the accumulation well 4 and the OD contact region 11 is made high enough by the LOD transistor TL. Furthermore, the potential of the potential barrier of the transfer channel RT is made higher than the potential of the potential barrier of the unwanted electric charge discharging channel RL. The accumulation well 4 is set at a relatively high concentration, and its potential before the accumulation of the electric charges is relatively low. When the accumulation is started, the electric charges are generated by light entered from the opening region 2 of the photo-diode PD, and are accumulated in the accumulation well 4. FIG. 7(A) shows the potential increase by the accumulation of the electric charges, with a satin pattern.

In the present embodiment, the potential barrier of the unwanted electric charge discharging channel RL and the potential barrier of the transfer channel RT are sufficiently high (potential is high), and the electric charges generated by incident light are accumulated in the accumulation well 4, without being transferred to the modulation well 5. Since the potential barrier of the transfer channel RT is higher than the potential barrier of the unwanted electric charge discharging channel RL, even if extremely strong light enters, the electric charges which overflow from the accumulation well 4 are discharged to the OD contact region 11 through the unwanted electric charge discharging channel RL, and will not flow into the modulation well 5.

In the transfer period shown in FIG. 7(B), 0.0V is applied to the ring gate (RG) 6, 0.0V is applied to the transfer gate (TX) 13, 2.5V is applied to the clear gate 14, 2.0V is applied to the LOD gate 12, 4.0V is applied to the drain D, and 0.0V is applied to the source.

Since 0V is applied to the transfer gate 13, the potential barrier of the transfer channel RT becomes low enough. Accordingly, the electric charges accumulated in the accumulation well 4 in the single accumulating period Sa described above and in the parallel accumulating periods Sa, Sc, and Sn, as will be described later, flow into the modulation well 5 through the transfer channel RT. In addition, by setting the drain voltage to a relatively high voltage, the potential gradient is increased and thus the transfer of the electric charges is made easy.

In addition, the potential barrier of the discharging channel by the clear gate 14 is also set high enough, and the electric charge stored in the modulation well 5 will not flow out into the discharging channel side. Moreover, also in the transfer period shown in FIG. 7(B), all the cells become the reading cells, and the same drive is carried out.

The reading period includes the signal modulation (S modulation) period for mainly reading the signal component (S), the noise modulation (N modulation) period for mainly reading the noise component (N), and the clear period for clearing the residual electric charges in order to read the noise component. By reading the signal component and the noise component to compare the picture signal, in which the cell variation and the various kinds of noises are removed is obtained. Namely, in the reading period, the S modulation period, the clear period, and the N modulation period are carried out in this order.

The same control is carried out in the S modulation period and the N modulation period. In the S/N modulation period shown in FIG. 7(C), with respect to the reading cell, as shown in the dashed line of FIG. 8, 2.5V is applied to the ring gate (RG) 6, 2.5V is applied to the transfer gate (TX) 13, 2.5V is applied to the clear gate 14, 2.0V is applied to the LOD gate 12, and 2.5V is applied to the drain D. Vg-Vths(=2.5-Vths) arises at the source (Vg is the gate voltage and Vths is the threshold voltage of the channel at the time of the S modulation).

The reading is carried out for each line. Only each cell of one line (reading line) out of all the lines becomes a reading cell, and each cell of other lines (non-reading lines) is a non-reading cell. Then, upon completion of the reading of each reading cell from the reading line, the reading line shifts, and each cell of the following line becomes a reading cell, and other cells become the non-reading cells. Similarly, the reading of the signal component (S modulation) or the reading of the noise component (N modulation) is carried out by shifting the reading line.

As for the reading cell, the potential barrier of the transfer channel RT is made high by the transfer transistor TT so that the electric charges stored in the modulation well 5 may not flow into the accumulation well 4. Since the voltage of the ring gate 6 is made high, the source potential increases accordingly. The threshold voltage of the channel of the modulation transistor TM changes corresponding to the electric charges stored in the carrier pocket 10. Namely, the source potential of the modulation transistor TM becomes the one corresponding to the generated amount of the photo-generated electric charges, i.e., the incident light, because the photo-generated electric charges accumulated in the accumulation well 4 of the photo-diode PD are transferred to the carrier pocket 10.

In addition, as for the non-reading cell, as shown in the solid line of FIG. 8, 0.0V is applied to the ring gate (RG) 6, 2.5V is applied to the transfer gate (TX) 13, 2.5V is applied to the clear gate 14, 2.0V is applied to the LOD gate 12, and 2.5V is applied to the drain D. Also in this case, Vg-Vths (=0-Vths) is generated in the source, however, since the voltage of the ring gate 6 is low, the output of the non-reading cell becomes a level sufficiently lower than the output of the reading cell. Therefore, only the output pixel signal of the reading cell appears at the source line.

In addition, since the potential difference applied to the ring gate 6 of the reading cell and of the non-reading cell is made high enough, even if, for example, the picture is dark or the like, the output pixel signal of the reading cell can be taken out from the source line securely.

In the clear period shown in FIG. 7(D), as for the reading cell, as shown in the dashed line of FIG. 8, 1.5V is applied to the ring gate (RG) 6, 2.5V is applied to the transfer gate (TX) 13, 0.0V is applied to the clear gate 14, 2.0V is applied to the LOD gate 12, 2.5V is applied to the drain D, and 5.0V is applied to the source.

Accordingly, the potential barrier of the discharging channel by the clear gate 14 is lowered sufficiently, and the electric charges remaining in the modulation well 5 are flowed from the discharging channel to the discharging contact region 15. Accordingly, the photo-generated electric charges in the modulation well 5 are removed, thereby enabling the reading of a noise component (noise modulation).

On the other hand, as for the non-reading cell, as shown in the solid line of FIG. 8, 1.5 V is applied to the ring gate (RG) 6, 2.5 V is applied to the transfer gate (TX) 13, 2.5 V is applied to the clear gate 14, 2.0 V is applied to the LOD gate 12, 2.5 V is applied to the drain D, and 5.0V is applied to the source.

Accordingly, the potential barrier of the residual electric charge discharging channel by the clear gate 14 is kept high.

The reading of the non-reading cell out of the cells per line after the blanking period passed in FIG. 6 has already been completed, however, as for the non-reading cells of the line before the blanking period passes, the reading has not been carried out yet. Then, in the non-reading cells, the electric charges are prevented from being discharged from the modulation well 5, by keeping the potential barrier of the discharging channel by the clear gate 14 high. The satin-pattern portion with respect to the non-reading cell of FIGS. 7(C) and (D) indicates that the electric charges, which has not been read, is stored in the modulation well 5.

According to the present embodiment, as described above, the parallel accumulation operation is carried out in the SIN modulation period and the clear period. FIGS. 7(C) and (D) show this parallel accumulation operation. Namely, in the reading period (S/N modulation and clear period), the photo-generated electric charges are accumulated in the accumulation well 4 by increasing the potential barrier of the transfer channel RT and the unwanted electric charge discharging channel RL. Accordingly, the reading period (modulation period and clear period) of the modulation transistor TM will be the accumulating period (parallel accumulating periods Ss, Sn, and Sc) for accumulating the photo-generated electric charges at the photo-diode PD side. In addition, in the parallel accumulating period Ss and Sn of FIG. 7(C), and the parallel accumulating period Sc of FIG. 7(D), the drain voltage is higher as compared with the single accumulating period Sa, and thus the conditions of accumulating the photo-generated electric charges differ. Moreover, as shown in FIGS. 7(C) and (D), the conditions of accumulating the photo-generated electric charges differ slightly between the reading cell and the non-reading cell.

Thus, in the single accumulating period Sa, the S/N modulation period, and the clear period, accumulation of the photo-generated electric charges are carried out in all the cells, and the accumulation time for each cell will be approximately one frame period as shown in FIG. 6. A provision is made to separately constitute the accumulation well 4 for accumulating the electric charges which is formed at the photo-diode PD side, and the modulation well 5 which is formed at the modulation transistor TM side, and to control the potential barrier of the transfer channel RT between both by the transfer transistor TT. Accordingly, the accumulation well 4 and the modulation well 5 can be set in the reading period and the parallel accumulating period of the same period, and thus the frame rate can be increased.

The PD clear period shown in FIG. 7(E) is adopted in a high-speed shutter mode or in a low-speed shutter mode as will be described later. As shown in FIG. 8, 0.0V is applied to the ring gate (RG) 6, 2.5V is applied to the transfer gate (TX) 13, 2.5V is applied to the clear gate 14, 0.0V is applied to the LOD gate 12, 4.0V is applied to the drain D, and the source impedance is made high. In addition, the driving voltage when the PD clear period is used in a normal mode is also the same as that of FIG. 7(E).

The potential barrier of the unwanted electric charge discharging channel RL is made low enough by lowering the voltage applied to the LOD gate, and the unwanted electric charges accumulated in the accumulation well 4 are discharged from the unwanted electric charge discharging channel RL to an external signal line through the OD contact region 11. In addition, when PD clear operation is adopted in a normal mode as shown in FIG. 6, the residual electric charges will not be left in the modulation well 5 portion of FIG. 7(E).

Problem of Carrier Leakage

Incidentally, as for the non-reading cell in the clear period, as mentioned above, 2.5V is applied to the clear gate 14, however, since a relatively high voltage of 5.0 V is applied also to the source, even if the potential barrier of the residual electric charge discharging channel is made high by the clear gate 14, it is not necessarily possible to surely keep the photo-generated electric charges being stored in the carrier pocket 10. That is, as for the non-reading cell in which the clear operation in the clear period has been carried out, the photo-generated-electric charges which can be accumulated are restricted to a predetermined value due to the carrier leakage.

As mentioned above, the carrier leakage occurs in the non-reading cells in the clear period. That is, as for each line, the carrier leakage occurs in the parallel accumulating periods Sc (clear period) (see FIG. 6) other than the period in which the line itself is made the blanking period. As for the carrier leakage, the upper limit value of the photo-generated electric charges which can be accumulated is just restricted, and the photo-generated electric charges left without leaking is constant regardless of the number of clear periods. That is, the photo-generated electric charges transferred to the modulation well 5 in the transfer period decreases due to the carrier leakage in the parallel accumulating period Sc during the blanking period of the line L1 of FIG. 6, and the amount of the photo-generated electric charge, which will be accumulated hereafter until a reading is completed, will not change. However, as for the line L1, a reading of the signal based on the accumulated photo-generated electric charge is carried out in the S modulation period before the carrier leakage in the clear period occurs. Therefore, a picture signal, in which the carrier leakage due to the clear period does not occur only in the line L1, will be obtained.

Moreover, a decimated reading may be carried out for a magnifying processing of a picture or the like. For example, if two times magnifying processing in the vertical direction is carried out, only each cell of the even-numbered lines will be read, for example. Also in this case, the carrier leakage due to the clear period does not occur only in the first line in which the reading is carried out by the decimated reading.

Therefore, the carrier leakage due to the clear period does not occur only in the line in which the reading is carried out at the beginning of each frame. Thus, if nothing is done, unevenness in the dynamic range and in the saturation output will be produced and the picture quality will degrade.

In addition, the OB region is formed in a portion where light does not enter in the periphery of the pixel region. When reading pixels of the OB region before reading the leading line of the effective pixel region, the carrier leakage also occurs in the leading line of the effective pixels, therefore, there will be no problem in particular. However, the OB region above the first line is not always used and the OB regions at the right side and the left side of the pixel region may be used. In such a case or when the decimated reading is carried out, with respect to the first line, a reading which is not influenced by the carrier leakage by the clear period will be carried out.

Specific Countermeasure for Carrier Leakage

Then, in the present embodiment, also with respect to the line firstly read after the transfer from the accumulation well 4 to the modulation well 5, the carrier leakage common to all the lines of a screen occurs by the same carrier leakage as that of the other lines, and thus the picture quality is improved by making the dynamic range and the saturation output uniform in the whole screen.

In the present embodiment, as shown in FIG. 6, a dummy clear period, in which, the same control as the control (clear)

for the non-reading cell of FIG. 7(D), is carried out to all the cells just before the reading after the transfer from the accumulation well 4 to the modulation well 5, is provided (see FIG. 8).

By the dummy clear period, also with respect to the first line or the line firstly read after the transfer, a reading after the carrier leakage will be carried out, and the dynamic range and the saturation output can be made the same for all the lines and the picture quality can be improved.

Driving Sequence

Next, the operation sequence of the decimation mode will be described. FIG. 9 is a timing chart showing a driving sequence at the time of the decimation mode.

Substantially the same driving as that of the normal mode of FIG. 6 mentioned above will be carried out at the time of the decimation mode of FIG. 9. That is the accumulation is the same as that of the normal mode, and the only difference is that the reading is carried out by decimating the lines with an interval corresponding to the decimation rate at the time of reading. In addition, since the number of the blanking period in one frame period is less than that of the normal mode, the single accumulating period Sa is set to a period longer than that of the normal mode, for example. Moreover, the PD clear period is omitted in the decimation mode of FIG. 9, however, it can also be omitted in a normal mode. Moreover, in FIG. 9, the single accumulating period Sa (line-out period) and the blanking period of FIG. 6 are combined to be shown as one pulse shape. In addition, as described above, the single accumulating period Sa is the time required for transferring data from the line memory, and actually takes time longer than that of the blanking period.

In the decimation mode of FIG. 9, the period of one frame period excluding the transfer period is the accumulating period for each cell. The leading timing of the next frame after the completion of the accumulating period is set to the transfer period. In the transfer period, the photo-generated electric charges being stored in the accumulation well 4 are transferred to the carrier pocket 10 in the modulation well 5, and accumulated.

Upon completion of the transfer period, the single accumulating period and the blanking period are repeated after the dummy clear period with the same control as that of the clear period during the blanking period, and the reading from the cells of each line corresponding to the decimation rate is successively carried out within one frame period.

Since the parallel accumulating period is set using a common time to the blanking period, it is not necessary to prepare another period for the accumulation, and thereby the frame rate can be speeded up.

In the present embodiment, the dummy clear period is set after the completion of the transfer period and before the blanking period. As shown in FIG. 8, a setup of each driving voltage in the dummy clear period is the same as that of the clear period in the reading period. All the cells are non-reading cells in this dummy clear period, and the same operation as that of the parallel accumulation operation at the time of the clear is carried out. That is, the same potential condition as that of the non-reading cell of FIG. 7(D) is generated in the dummy clear period. Accordingly, the carrier leakage occurs from the carrier pocket 10 in the modulation well 5, and the upper limit value of the photo-generated electric charges which can be accumulated is restricted.

Upon completion of the dummy clear period, reading is started. For example, if the reading of only even-numbered lines is carried out in order to magnify a picture by twice, a line L2 will be the selected line in the first blanking period after the completion of the dummy clear period, and the other lines will be the non-selected lines. Accordingly, the picture signal based on a photo-accumulated electric charge is read from each cell of the line L2. In this blanking period, the carrier leakage has already occurred in the photo-accumulated electric charge in the carrier pocket 10 of each cell of the line L2.

In the next blanking period, a line L4 will be the selected line, the other lines will be the non-selected lines, and the reading of the picture signal from each cell of the line L4 is carried out. Also in this case, the carrier leakage occurs in the photo-generated electric charge accumulated in the carrier pocket 10 of each cell of the line L4.

Thereafter, the same operation is repeated, and a picture signal is read from the line corresponding to the decimation rate of the decimated reading. Also as for the line in which the first reading is carried out, the carrier leakage by the dummy clear period occurs, and thus the dynamic range and the saturation output with respect to all the lines can be made uniform, and the picture quality can be improved.

FIG. 10 is a timing chart showing a driving sequence by the same method as that of FIG. 9.

FIG. 10(A) shows a driving sequence in a high-speed shutter mode.

The high-speed shutter mode is used, for example, for shortening the accumulating period. In addition, in the conventional examples, since provision is made to discharge the residual electric charges of the first well upon completion of the blanking, the high-speed shutter mode or the like according to the present embodiment cannot be implemented.

For example, when extremely bright light is incident upon the photo diode PD, the amount of the electric charges which flows into the modulation well 5 of each cell increases extremely, and the picture based on the pixel signal read from each cell will be whitish (bright) as a whole and the contrast thereof will degrade. In such a case, the high-speed shutter mode is adopted. In the high-speed shutter mode, as shown in FIG. 10(A), the PD clear period is set to an arbitrary position in one frame period. As described above, the accumulating period is a period from the completion of the PD clear in the preceding frame to the starting time of the transfer period.

As shown in FIG. 7(E), in the PD clear period, the electric charges accumulated in the accumulation well 4 discharged to the outside through the OD contact region 11. Accordingly the photo-generated electric charges generated after the completion of PD clear period are accumulated in the accumulation well 4. After the completion of the PD clear period, the single accumulating period Sa and the parallel accumulating periods Ss, Sc, and Sn are cyclically repeated until the completion of the frame period. Thus, after the accumulation is carried out only for the time shorter than the one frame period corresponding to the position of the PD clear period, the photo-generated electric charges accumulated in the accumulation well 4 are transferred to the modulation well 5 in the transfer period at the beginning of the frame.

The reading is the same as that of the normal mode, and while the reading line is sequentially shifting, the reading of all lines completes in one frame period. In addition, as for the cell where the reading has not been completed, as shown in FIG. 7(E), the electric charges are being stored in the modulation well 5, and can be read in one frame period regardless of the accumulating period based on the position of the PD clear period.

For example, in case that the PD clear period is set to the approximate center of one frame period, the accumulating period will be about a half of one frame period, and the amount of the electric charges which flow into the modulation well 5 will be about a half of that of the normal mode, and the brightness of the picture based on the pixel signal read from each cell can be made adequate. Thereby, a picture having sufficient contrast, though it is bright, can be obtained.

In addition, since the PD clear period can be easily set up by applying the driving voltage shown in FIG. 8 to each part, the PD clear period can be arranged in an arbitrary position corresponding to the brightness of the picture. Therefore, the accumulating period can be set up without restraint, and the pixel signal having an optimal level corresponding to the brightness of the picture can be obtained from each cell.

Moreover, at the time of the high-speed shutter mode, the dummy clear period is set up before the first reading in one frame period. Accordingly, even if the reading of the OB region has not been carried out before reading the pixel signal in the effective pixel region, the same carrier leakage as that of the other lines occurs with respect to the first reading line in one frame period. Therefore, the dynamic range and the saturation output which are uniform in all the pixels can be obtained, and thus the picture quality can be improved.

FIG. 10(B) shows the driving sequence in the low-speed shutter mode.

The low-speed shutter mode is used, for example, for making the accumulating period longer than one frame period. For example, when light incident upon the photo-diode PD is dark, the amount of the electric charges which flow into the modulation well 5 of each cell will decrease, and the picture based on the pixel signal read from each cell will be dark as a whole. In such a case, the low-speed shutter mode is adopted. In the low-speed shutter mode, while the PD clear period is inserted once per a plurality of frame periods, the transfer period is inserted once per a plurality of frame periods.

In an example of FIG. 10(B), the PD clear period is inserted once per two frame periods, and the transfer period is set at the leading timing of the frame of one and half frame periods after the completion of this PD clear period. Therefore, the accumulating period in this case will be one and a half frame periods. Thereby a picture having approximately one and a half times brightness as compared with the normal mode can be obtained. In addition, in the case of FIG. 10(B), the reading from each cell will be carried out only once per two frame periods, and the frame rate will be a half of the normal mode.

By adopting the shutter mode of FIGS. 10(A) and (B), the accumulating period can be set up without restraint, and the optimal picture corresponding to the brightness of incident light can be obtained.

In addition, also in the low-speed shutter mode, the reading is carried out within approximately one frame period after the transfer period. Conventionally, the accumulated photo-generated electric charges are also discharged by reading, therefore, in the following one frame period after reading, a dummy-reading involving the clear operation which does not contribute to the picture signal, cannot be carried out. On the other hand, in the present embodiment, since the reading operation can be carried out simultaneously with the accumulation of the photo-generated electric charges, the dummy-reading involving the clear operation can be carried out even in the following one frame period after reading. Accordingly, there is an advantage that the configuration of the logic circuit for performing the reading operation can be simplified.

Moreover, at the time of the low-speed shutter mode, the dummy clear period is set before the first reading in one frame period. Even in this case, the dynamic range and the saturation output which are made uniform in the pixels of all lines can be obtained, and thus the picture quality can be improved.

Incidentally, as shown in FIG. 8, in the dummy clear period, the same control as that of the clear period during the blanking period is carried out. However, in the clear period during the blanking period, there exist the S modulation period and the N modulation period before and after the clear period, and on the other hand, the dummy clear period of FIG. 8 is independently used. For this reason, it can be conceivable that influence of the carrier leakage (restriction level of the photo-generated electric charge which can be stored) differs between in the clear period during the blanking period and in the dummy clear period.

Then, it is conceivable that also in the dummy clear period, the S modulation, the clear, and the N modulation, the same as the blanking period, are carried out. FIG. 11 shows the change of the driving voltage in each period in this case. In addition, in FIG. 11, the actual driving sequence differs from the order of the period to be set. In FIG. 11, as for the blanking period, the driving voltage for the reading cell is shown as the dashed line, and the driving voltage for the non-reading cell is shown as the solid line.

As shown in FIG. 11, the dummy clear period is constituted by the S modulation period, the clear period, and the N modulation period. Since the same control is carried out in the dummy clear period and in the blanking period, the same effect of the carrier leakage is obtained in the clear operation during the dummy clear period and in the clear operation during the blanking period.

Accordingly, in the entire region of the screen, more uniform dynamic range and saturation output can be obtained, and thus the picture quality can be further improved.

FIG. 12 shows another configuration in the dummy clear period. In FIG. 12, the dummy clear period is included in the transfer period. The dummy clear is carried out whenever the transfer is carried out Also in this case, the dummy clear will be carried out before the first reading in one frame period, and also as for the first reading line of one frame period, the same carrier leakage as that of the other lines occurs. Therefore, the dynamic range and the saturation output which are uniform in all the pixels can be obtained, and thus the picture quality can be improved.

Moreover, an example of FIG. 12 can be applied to various kinds of driving sequences, because the dummy clear is carried out every time the transfer is completed.

What is claimed is:

1. A solid state imaging device, comprising:
   a pixel region formed by arranging a cell in a matrix form, the cell including:
     a photoelectric conversion element that generates photo-generated electric charges corresponding to incident light;
     an accumulation well that accumulates the photo-generated electric charges;
     a modulation well that stores the photo-generated electric charges transferred from the accumulation well;
     a modulation transistor having a threshold voltage of a channel controlled by the photo-generated electric charges stored in the modulation well and that outputs a pixel signal corresponding to the photo-generated electric charges; and
     a residual electric charge discharging control element that controls a potential barrier of a residual electric charge discharging channel coupled to the modulation well and discharges the residual electric charges in the modulation well through the residual electric charge discharging channel;
   a reading means for driving the modulation transistor and the residual electric charge discharging control element, and carrying out mutually different controls to a cell where a reading is carried out, and to a cell where a reading is not carried out, in a modulation period when a signal modulation output based on the photo-generated electric charges accumulated in the modulation well, and a noise modulation output based on a noise component are obtained;

a clear means for driving the modulation transistor and the residual electric charge discharging control element, and carrying out mutually different controls to a cell where a clear is carried out, and to a cell where a clear is not carried out, in a clear period when residual electric charges remaining in the modulation well are discharged; and a dummy clear means for controlling the clear means, and carrying out, a control for a cell where the clear is not carried out by the clear means, to all the cells, before reading a first line from a pixel region.

2. The solid state imaging device according to claim 1, wherein the dummy clear means carries out, the control for the cell where the reading is not carried out by the modulation means, the control for the cell where the clear is not carried out by the clear means, and the control for the cell where the reading is not carried out by the modulation means, to all the cells, before reading the first line from the pixel region.

3. The solid state imaging device according to claim 1, further comprising a transfer control element that controls transfer of the photo-generated electric charges by changing the potential barrier of the transfer channel between the accumulation well and the modulation well, wherein the dummy clear means carries out, the control for the cell where the clear is not carried out by the clear means, to at least all the cells of effective pixels, after transferring the photo-generated electric charges by the transfer control element.

4. The solid state imaging device according to claim 1, wherein the first line where a reading is carried out from the pixel region is a line that is read at the time of decimating process.

5. A method of driving a solid state imaging device, the device including:
   an accumulation well that accumulates photo generated electric charges generated by a photoelectric conversion element corresponding to incident light;
   a modulation well that controls a threshold voltage of a channel of a modulation transistor by storing the photo-generated electric charges;
   a residual electric charge discharging control element that controls a potential barrier of a residual electric charge discharging channel coupled to the modulation well;
   a reading means for driving the modulation transistor and the residual electric charge discharging control element, and carrying out mutually different controls with respect to a cell where a reading is carried out, and to a cell where a reading is not carried out, in a modulation period that a signal modulation output based on the photo-generated electric charges accumulated in the modulation well, and a noise modulation output based on a noise component are obtained;
   a clear means for driving the modulation transistor and the residual electric charge discharging control element, and carrying out mutually different controls to a cell where a clear is carried out and to a cell where a clear is not carried out in a clear period that, residual electric charges remaining in the modulation well are discharged;
   the method comprising:
   a dummy clear step for carrying out a control for a cell where the clear is not carried out by the clear means, to all the cells, before reading the first line from a pixel region; and
   a reading step including a signal modulation by the reading means, a clear by the clear means, and a noise modulation by the reading means.

6. The method of driving a solid state imaging device according to claim 5, wherein the dummy clear step carries out the control for the cell where the reading is not carried out by the modulation means, the control for the cell where the clear is not carried out by the clear means, and the control for the cell where there reading is not carried out by the modulation means, to all the cells, before reading the first line from the pixel region.

7. The method of driving the solid state imaging device according to claim 5, wherein the solid state imaging device further comprises a transfer control element that controls a potential barrier of a transfer channel between the accumulation well and the modulation well, and the dummy clear step carries out the control for the cell where the clear is not carried out by the clear means, to all the cells, after transferring the photo-generated electric charges by the transfer control element.

8. A solid state imaging device, comprising:
   a pixel region having a cell in a matrix form the cell including:
      a photoelectric conversion element generating photo-generated electric charges corresponding to incident light;
      an accumulation well accumulating the photo-generated electric charges;
      a modulation well storing the photo-generated electric charges transferred from the accumulation well;
      a modulation transistor having a threshold voltage of a channel controlled by the photo-generated electric charges stored in the modulation well and outputting a pixel signal corresponding to the photo-generated electric charges; and
      a residual electric charge discharging control element controlling a potential barrier of a residual electric charge discharging channel coupled to the modulation well and discharging the residual electric charges in the modulation well through the residual electric charge discharging channel;
   a reader that drives the modulation transistor and the residual electric charge discharging control element, and carries out different controls to a cell where reading is carried out, and to a cell where reading is not carried out, in a modulation period when a signal modulation output based on the photo-generated electric charges accumulated in the modulation well, and a noise modulation output based on a noise component are obtained;
   a clearer that drives the modulation transistor and the residual electric charge discharging control element, and carries out different controls to a cell where a clear is carried out, and to a cell where a clear is not carried out, in a clear period when residual electric charges in the modulation well are discharged; and
   a dummy clearer that controls the clearer, and carries out a control for a cell where the clear is not carried out by the clearer, to all the cells, before reading a first line from a pixel region.

* * * * *